United States Patent
Wang et al.

(10) Patent No.: US 11,910,690 B2
(45) Date of Patent: Feb. 20, 2024

(54) ELECTRONIC DEVICES WITH ILLUMINATED DISPLAY BORDERS

(71) Applicant: Apple Inc., Cupertino, CA (US)

(72) Inventors: Paul X Wang, Cupertino, CA (US); Dinesh C. Mathew, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/470,881

(22) Filed: Sep. 9, 2021

(65) Prior Publication Data

US 2021/0408169 A1    Dec. 30, 2021

Related U.S. Application Data

(63) Continuation of application No. 16/452,171, filed on Jun. 25, 2019, now Pat. No. 11,164,917.

(Continued)

(51) Int. Cl.

| | |
|---|---|
| *G09G 3/00* | (2006.01) |
| *H10K 59/50* | (2023.01) |
| *G02F 1/13357* | (2006.01) |
| *G09F 9/30* | (2006.01) |
| *H10K 50/854* | (2023.01) |
| *H10K 50/858* | (2023.01) |
| *H10K 59/12* | (2023.01) |
| *H10K 59/40* | (2023.01) |
| *H10K 59/65* | (2023.01) |
| *H10K 77/10* | (2023.01) |

(Continued)

(52) U.S. Cl.
CPC ....... *H10K 59/50* (2023.02); *G02F 1/133603* (2013.01); *G02F 1/133608* (2013.01); *G09F 9/301* (2013.01); *G09G 3/03* (2020.08); *H10K 50/854* (2023.02); *H10K 50/858* (2023.02); *H10K 59/12* (2023.02); *H10K 59/40* (2023.02); *H10K 59/65* (2023.02); *H10K 77/111* (2023.02); *G09G 3/3208* (2013.01); *G09G 2380/02* (2013.01); *H10K 2102/311* (2023.02)

(58) Field of Classification Search
CPC ......... G02F 1/133615; G02F 1/133616; G06F 1/163
See application file for complete search history.

(56) References Cited

U.S. PATENT DOCUMENTS

| | | | |
|---|---|---|---|
| 6,037,612 A | 3/2000 | Nishimura et al. | |
| 6,421,302 B1 * | 7/2002 | Wimberly | ............ G04G 9/0082 368/228 |

(Continued)

*Primary Examiner* — Kevin M Nguyen
(74) *Attorney, Agent, or Firm* — Treyz Law Group, P.C.; G. Victor Treyz; David K. Cole

(57) ABSTRACT

An electronic device may have a display mounted in a housing. The display may be mounted on a front side of the device and the housing may have a housing wall on the rear side of the device. The display may be formed from an array of pixels configured to display an image for a user. Pixel-free border areas that run along the edges of the array of pixels may be provided with an edge illuminator. The edge illuminator may provide illumination to the border areas during operation of the device. The edge illuminator may have crystalline semiconductor light-emitting diode dies, backlit liquid crystal devices or electrophoretic display components, or may have a light guide that is supplied with illumination from a light-emitting diode.

20 Claims, 24 Drawing Sheets

Related U.S. Application Data

(60) Provisional application No. 62/731,493, filed on Sep. 14, 2018.

(51) Int. Cl.
    *G09G 3/3208* (2016.01)
    *H10K 102/00* (2023.01)

(56) References Cited

U.S. PATENT DOCUMENTS

| | | | |
|---|---|---|---|
| 6,575,618 B1 * | 6/2003 | Inoue | G04B 19/283 |
| | | | 368/69 |
| 8,886,334 B2 | 11/2014 | Ghaffari et al. | |
| 9,496,602 B2 | 11/2016 | Kasar | |
| 10,048,767 B2 * | 8/2018 | Yoo | G06F 3/0482 |
| 2012/0218219 A1 | 8/2012 | Rappoport et al. | |
| 2012/0327654 A1 | 12/2012 | Bhattacharya et al. | |
| 2013/0088671 A1 | 4/2013 | Drzaic et al. | |
| 2014/0049522 A1 | 2/2014 | Mathew et al. | |
| 2014/0184057 A1 | 7/2014 | Kim et al. | |
| 2015/0185942 A1 | 7/2015 | Kim et al. | |
| 2015/0325815 A1 | 11/2015 | Kang et al. | |
| 2016/0313593 A1 * | 10/2016 | Grip | G02F 1/133514 |
| 2017/0229621 A1 | 8/2017 | Chen et al. | |
| 2017/0242506 A1 | 8/2017 | Patel et al. | |
| 2017/0277323 A1 | 9/2017 | Kim et al. | |
| 2017/0346026 A1 | 11/2017 | Lee et al. | |
| 2018/0042513 A1 * | 2/2018 | Connor | A61B 5/6824 |
| 2018/0156660 A1 * | 6/2018 | Turgeon | G09G 5/10 |
| 2018/0173036 A1 | 6/2018 | Kim et al. | |

* cited by examiner

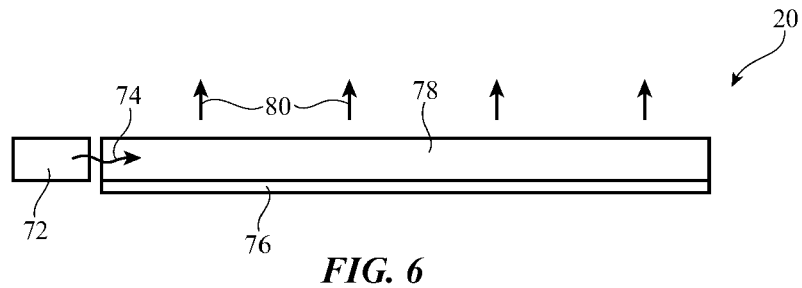
*FIG. 6*
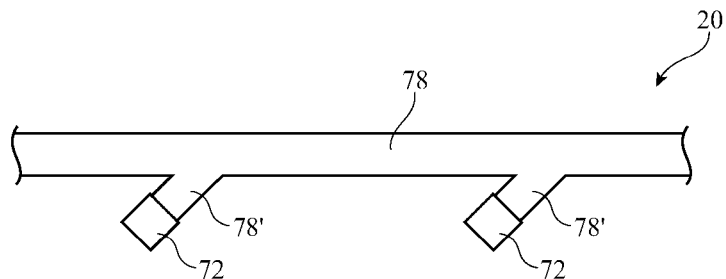
*FIG. 7*
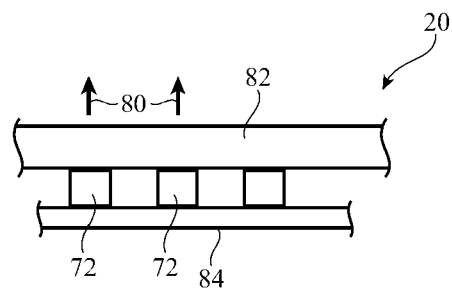
*FIG. 8*
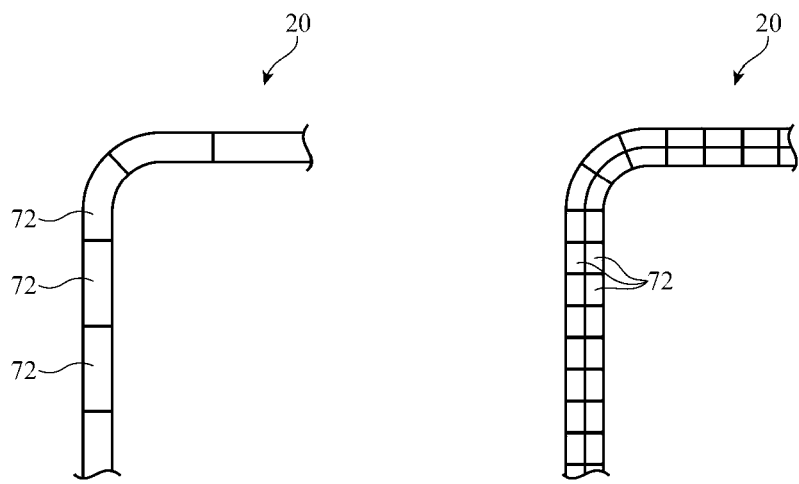
*FIG. 9*  *FIG. 10*

ELECTRONIC DEVICES WITH ILLUMINATED DISPLAY BORDERS

This application is a continuation of U.S. patent application Ser. No. 16/452,171, filed Jun. 25, 2019, which claims the benefit of provisional patent application No. 62/731,493, filed Sep. 14, 2018, which are hereby incorporated by reference herein in their entireties.

FIELD

This relates generally to electronic devices, and, more particularly, to electronic devices with displays.

BACKGROUND

Electronic devices such as cellular telephones include displays. Displays may be used in providing visual output to a user. Touch sensitive displays may be used in gathering user input.

Displays generally contain opaque borders. Signal routing lines, encapsulation structures, display driver circuits, and other portions of a display that do not emit light are formed along these opaque borders.

If care is not taken, the opaque borders in a display may be overly large. This can create undesired bulk in an electronic device and can detract from the visual appearance of the electronic device.

SUMMARY

An electronic device may have a display mounted in a housing. The display may be mounted on a front side of the device and the housing may have a housing wall on the rear side of the device. The display may be formed from an array of pixels configured to display an image for a user. Pixel-free border areas that run along the edges on the array of pixels may be provided with an edge illuminator. The edge illuminator may provide illumination to the border areas during operation of the device.

The edge illuminator may have crystalline semiconductor light-emitting diode dies. The crystalline semiconductor light-emitting dies may be mounted on printed circuit substrates and may extend in a ring around the pixel array and/or may fill a notch in the pixel array. In some arrangements, the printed circuit may be rigid and may have staggered layers and/or a locally thinned region. If desired, the edge illuminator may be formed using liquid crystal devices or electrophoretic components. Arrangements in which the edge illuminator has a light guide that is supplied with illumination from light-emitting diodes may also be used.

To accommodate curved edge portions in the electronic device, the edge illuminator may have light-emitting diodes mounted on an elastomeric mesh-shaped substrate or other flexible substrate. The flexible substrate may bend to accommodate curved edge portions of the device and/or corners having surfaces with compound curvature.

Light from the edge illuminator may be diffused. With one illustrative arrangement, a translucent polymer frame member may be formed between a portion of the housing and a display cover layer. Light-emitting diodes in the edge illuminator may supply light that passes through the translucent polymer frame member. The light-emitting diodes in the edge illuminator may also produce light that passes through an edge portion of the display cover layer and/or perforations or other holes in the housing.

If desired, the housing for the electronic device may include fabric. Edge illuminator light-emitting diodes may provide illumination in the portion of the device that includes the fabric. Fresnel lenses and diffusers may be used to help obscure a boundary between a pixel array that is displaying an image for a user and adjacent light-emitting diodes in an edge illuminator. Light-emitting diodes in an edge illuminator may be mounted on a flexible printed circuit that has holes to accommodate aligned optical components (e.g., in a pixel-free notch along an edge of the array) and/or may be mounted to other substrates such as a substrate that also includes light-emitting diodes for a backlight or a substrate that contains the pixels of the pixel array.

BRIEF DESCRIPTION OF THE DRAWINGS

FIGS. 6 and 7 are cross-sectional side views of illustrative light-guide layers being illuminated using light-emitting diodes accordance with an embodiment.

FIG. 8 is a cross-sectional side view of an illustrative transparent layer being illuminated by an array of light-emitting diodes in accordance with an embodiment.

FIGS. 9 and 10 are top views of illustrative illuminated display border areas in accordance with embodiments.

DETAILED DESCRIPTION

An electronic device may be provided with a display. The display may have an array of pixels for displaying images. The electronic device may include an edge illuminator that extends along a border surrounding the array of pixels and that provide illumination for the border. Liquid crystal display cells and/or electrophoretic (e-ink) display cells, light guide layers, thin-film light-emitting diodes, crystalline semiconductor light-emitting diodes, and/or other components may be used in forming the edge illuminator.

Figure 1:
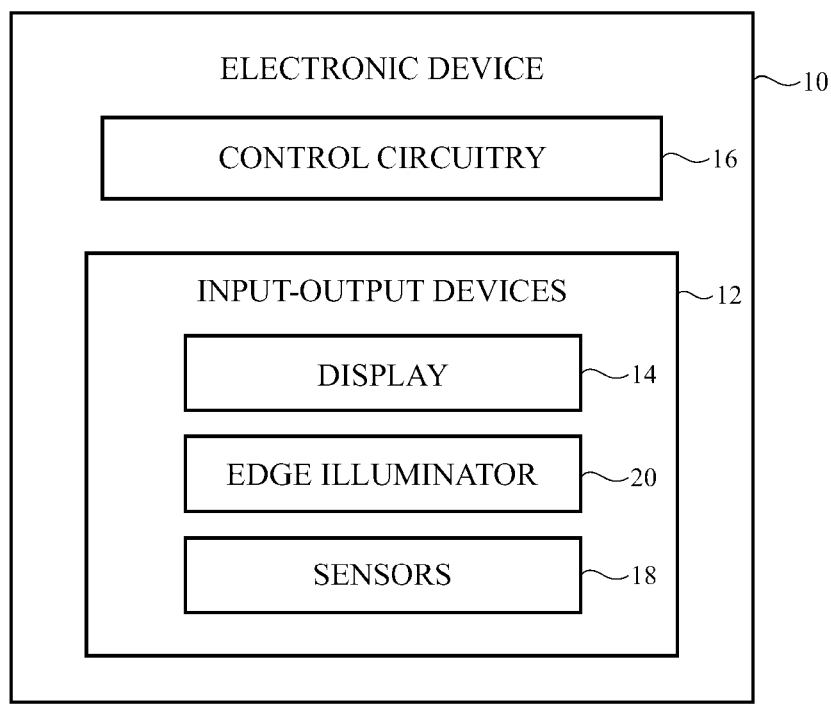
FIG. 1 is a schematic diagram of an illustrative electronic device in accordance with an embodiment.

An illustrative electronic device of the type that may have an edge illuminator is shown in FIG. 1. Electronic device 10 may be a computing device such as a laptop computer, a computer monitor containing an embedded computer (e.g., a desktop computer formed from a display with a desktop stand that has computer components embedded in the same housing as the display), a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, a tower computer, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc. Control circuitry 16 may include wired and/or wireless communications circuitry (e.g., antennas and associated radio-frequency transceiver circuitry such as cellular telephone communications circuitry, wireless local area network communications circuitry, etc.). The communications circuitry of control circuitry 16 may allow device 10 to communicate with keyboards, computer mice, remote controls, speakers, accessory displays, accessory cameras, and/or other electronic devices that serve as accessories for device 10.

Input-output circuitry in device 10 such as input-output devices 12 may be used to allow data to be supplied to device 10 and to allow data to be provided from device 10 to external devices. Input-output devices 12 may include input devices that gather user input and other input and may include output devices that supply visual output, audible output, or other output. These devices may include buttons, joysticks, scrolling wheels, touch pads, key pads, keyboards, microphones, speakers, tone generators, vibrators and other haptic output devices, light-emitting diodes and other status indicators, data ports, etc.

Input-output devices 12 may include one or more displays such as display 14. Devices 12 may, for example, include an organic light-emitting diode display with an array of thin-film organic light-emitting diode pixels, a liquid crystal display with an array of liquid crystal display pixels and an optional backlight unit, a display having an array of pixels formed from respective crystalline light-emitting diodes each of which has a respective crystalline semiconductor light-emitting diode die, and/or other displays. In some configurations, input-output devices 12 may include a projector display based on a micromechanical systems device such as a digital micromirror device or other projector components.

Display 14 may be a touch screen display that includes a touch sensor for gathering touch input from a user or display 14 may be a touch insensitive display that is not sensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

At suitable locations within device 10 such as along one or more portions of the peripheral edge of display 14, device 10 may include illumination structures such as edge illuminator 20. Edge illuminator 20 may include one or more light-emitting diodes (e.g., organic light-emitting diodes and/or crystalline semiconductor light-emitting diodes), one or more lasers (e.g., laser diodes), one or more individually adjustable components that adjust light transmission and/or reflection and that are illuminated by a backlight or by ambient light (e.g., a liquid crystal display structure such as one or more liquid crystal light modulator cells or an array of such cells, an electronic ink display structure sometimes referred to as an electrophoretic display structure such as one or more electrophoretic cells or an array of such cells), and/or other electrically adjustable light-emitting and/or light modulating components. Illustrative configurations in which edge illuminator 20 includes one or more light-emitting components such as one or more light-emitting diodes may sometimes be described herein as an example. In general, any suitable light-emitting and/or light modulating components may be formed in edge illuminator 20, if desired. Edge illuminators may have ring shapes that extend around the entire border of a rectangular pixel array or other display and/or may have shapes that extend along portions of a display border. If desired, there may be two or more edge illuminators 20 in device 10 (e.g., a first illuminator 20 on a left side of device 10 and a separate a second illuminator on a right side of device 10, etc.). Such illuminators may be controlled in coordination with each other and/or may be individually controlled.

Edge illuminator 20 may include a single light-emitting component, two light-emitting components, 2-100 light-emitting components, at least 20 light-emitting components, fewer than 2000 light-emitting components, fewer than 400 light-emitting components, fewer than 100 light-emitting components, fewer than 40 light-emitting components, fewer than 25 light-emitting components, fewer than ten light-emitting components, or other suitable number of individually or collectively controllable light-emitting components. These light-emitting components may be used to emit light of any suitable color (white, a non-neutral color such as red, green, blue, etc.). In some arrangements, edge illuminator 20 may include one or more light guides, diffusers, reflectors, and/or other structures for distributing light from one or more light-emitting components to desired locations (e.g., locations along the border of display 14). If desired, edge illuminator 20 may include a one-dimensional array or a two-dimensional array of light-emitting components (e.g., light-emitting diode pixels). Edge illuminator 20 may include a large number or light-emitting diodes or may contain only a single light-emitting diode or other small number of light-emitting diodes or other light-emitting components (e.g., so that edge illuminator 20 may emit diffuse illumination of a single color and/or may emit other illumination from a single component or other small number of light-emitting components).

Input-output devices 12 may also include sensors 18. Sensors 18 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 18 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors. In some arrangements, device 10 may use sensors 18 and/or other input-output devices to gather user input (e.g., buttons may be used to gather button press input, touch sensors overlapping displays can be used for gathering user touch screen input, touch pads may be used in gathering touch input, microphones may be used for gathering audio input, etc.).

If desired, electronic device 10 may include additional components (see, e.g., other devices in input-output devices 12). The additional components may include haptic output devices, audio output devices such as speakers, light sources such as light-emitting diodes (e.g., crystalline semiconductor light-emitting diodes for status indicators and/or components), other optical output devices, and/or other circuitry for gathering input and/or providing output. Device 10 may also include an optional battery or other energy storage device, connector ports for supporting wired communications with ancillary equipment and for receiving wired power, and other circuitry. Device 10 may be operated in systems that include wired and/or wireless accessories (e.g., keyboards, computer mice, remote controls, trackpads, etc.).

Figure 2:
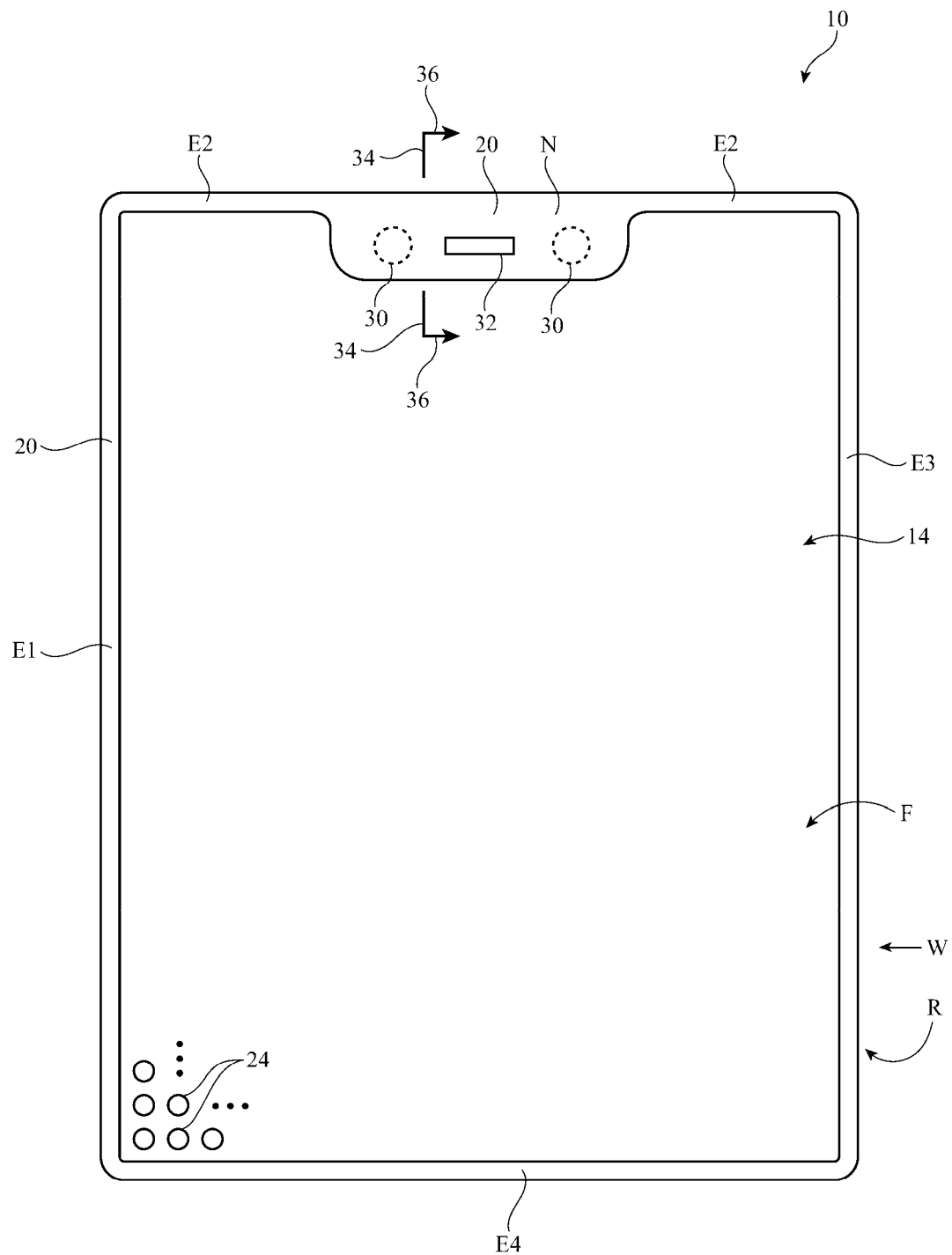
FIG. 2 is a front view of an illustrative electronic device in accordance with an embodiment.

FIG. 2 is a front view of device 10 in an illustrative configuration in which device 10 is a portable electronic device such as a cellular telephone or other handheld device. As shown in FIG. 2, device 10 may include an array of pixels 24 that form an active area for display 14 in which display 14 displays images for a user. Pixels 24 may extend over front side F of device 10. In some configurations, some or all of peripheral edge of device 10 is curved (e.g., the edge of device 10 has a curved cross-sectional profile). In other configurations, some or all of the peripheral edge of device 10 has vertical sidewalls and/or other sidewall shapes. The front of device 10 may be covered with a glass layer, polymer layer, or other transparent display cover layer. Some or all of the housing sidewall structures in device 10 (e.g., a housing layer on sidewall W) may be formed from integral portions of the display cover layer and/or separate housing structures. The housing of device 10 may also have portions covering some or all of the rear side R of device 10.

Display 14 may have a rectangular outline as shown in FIG. 2 or may have other suitable shapes. The periphery of display 14 may be surrounded by a border region that is free of pixels. The border region may be used to accommodate display driver circuits, metal traces for signal lines, encapsulation structures (e.g., beads of adhesive, etc.), and/or other structures that do not emit light, but which form part of the circuitry and associated structures of display 14. In the example of FIG. 2, border notch N is formed along a section of the upper edge of display 14 and extends into the pixels of display 14, thereby displacing pixels from a rectangular recess in display 14. Display 14 may be rectangular and may have four peripheral edge segments. The opposing left and right edge segments may have no notches and the lower edge segment may have no notch. In this type of arrangement, notch N along the upper edge segment of the rectangular periphery of display 14 may be the only notch (recess) that protrudes into the array of pixels in display 14.

Notch N is free of pixels 24. This allows notch N to accommodate speaker opening 32 and optical sensor windows 30. Sensor windows 30 may be used to allow light to enter and/or exit the interior of device 10 without passing through pixels 24. For example, sensor windows 30 may be aligned with optical components such as a camera, a camera flash, an optical proximity sensor, an ambient light sensor, and a structured light sensor that emits infrared light beams and detects corresponding spots on target objects to capture three-dimensional images of those objects, and/or other optical components. In the example of FIG. 2, pixel-free areas run around the entire periphery of display 14 and device 10. For example, in addition to notch N, the rest of the border surrounding display 14 (e.g., the portion of device 10 running along the left, upper, right, and lower edge segments of the periphery of display 14) is also free of pixels 24 (see, e.g., left edge E1, upper edge E2, right edge E3, and lower edge E4).

Although free of pixels 24 of display 14, one or more portions of the border surrounding display 14 (e.g., the regions associated with edge E1, E2 and associated notch N, E3, and E4) may be provided with light from an edge illuminator such as edge illuminator 20 of FIG. 2. Edge illuminator 20 may, for example, fill notch N and the other edge portions surrounding display 14. In this way, the entire front face of device 10 may be illuminated, providing device 10 with a desired appearance. Edge illuminator 20 may provide light that matches or compliments the color of the content on display 14, may provide light that has different colors, intensities, etc. in different areas, may provide static light, may provide light that flashes on and off and/or that otherwise varies in intensity and/or color as a function of time, may provide solid regions of color, may include text, graphics, icons, moving images, and other visual output. To conserve power and reduce complexity and to incorporate edge illuminator 20 into portions of device 10 with curved surfaces (e.g., sidewalls), edge illuminator 20 may, if desired, be provided with less spatial resolution than pixels 24 of display 14 (as an example).

Figure 3:
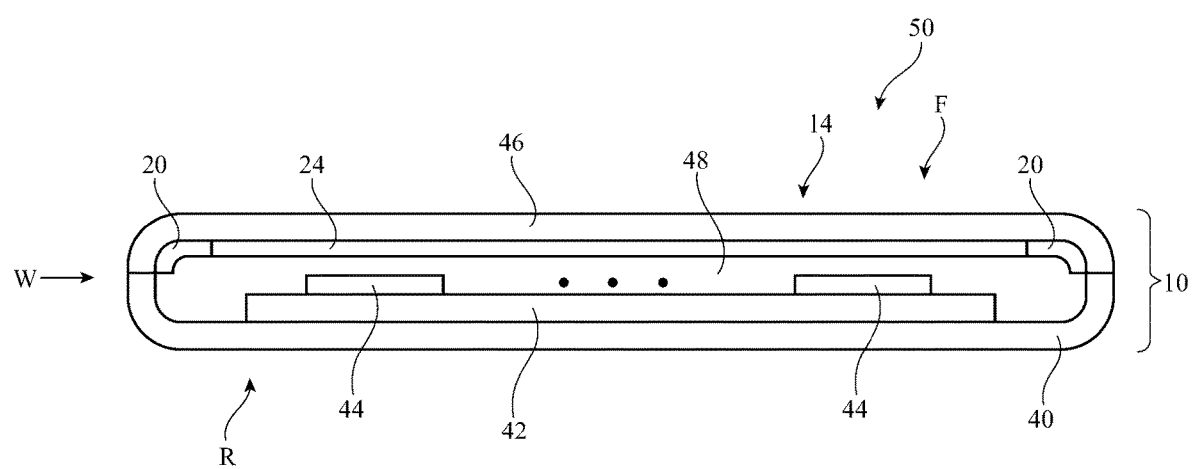
FIG. 3 is a cross-sectional side view of an illustrative electronic device in accordance with an embodiment.

FIG. 3 is a cross-sectional side view of device 10 of FIG. 2 taken along line 34 and viewed in direction 36 of FIG. 2. As shown in FIG. 3, device 10 may have a housing such as housing 40 that covers rear side R of device 10 and, if desired, portions of sidewall W and front side F. Housing structures in device 10 such as housing 40 (e.g., a rear housing wall and/or other housing structures) may be formed from glass, metal, polymer, crystalline materials such as sapphire, natural materials such as wood, fabric, other materials, and/or combinations of two or more of these materials. For example, device 10 may have a rear housing wall on rear side R that is formed from glass, metal, or other housing materials. Portions of this rear housing wall and/or other housing structures may cover some or all of sidewall W.

Display 14 may be formed from an array of pixels 24 on front side F of device 10 (as an example). Edge illuminator 20 may run along one or more of the peripheral portions of the pixel array formed from pixels 24 of display 14. The presence of edge illuminator 20 may allow device 10 to emit light around the border of display 14 that would otherwise be unilluminated due to the absence of pixels 24. The illumination from illuminator 20 may thereby enhance the appearance of device 10. If desired, the light emitting by illuminator 20 may be used to display visual content (e.g., using colors, time variations, and/or spatial patterns).

Display cover layer 46 may cover the pixel array formed from pixels 24 (e.g., display 14) and, if desired, may cover edge illuminator 20. Display cover layer 46 may be formed from transparent materials such as glass, polymer, sapphire and other crystalline materials, transparent ceramic, and/or other transparent materials. Display cover layer 46 may form a portion of the housing of device 10. The housing of device 10 may enclose and define an interior region such as interior region 48 and may separate interior region 48 from exterior region 50 surrounding device 10. Electrical components 44 (e.g., control circuitry 16 and/or input-output devices 12 of FIG. 1) may be mounted on one or more printed circuits 42 in interior 48. The inner and/or outer surfaces of display cover layer 46 may include planar portions and/or portions with curved cross-sectional profiles.

Edge illuminator 20 may be formed from one or more light-emitting components (e.g., light-emitting devices such as light-emitting diodes, lasers, etc.) and/or from adjustable optical components such as electrophoretic display devices that are illuminated by backlight and/or ambient reflections. Illustrative configurations in which light-emitting diodes are used in providing illumination for edge illuminator 20 are sometimes described herein as an example.

Figure 4:
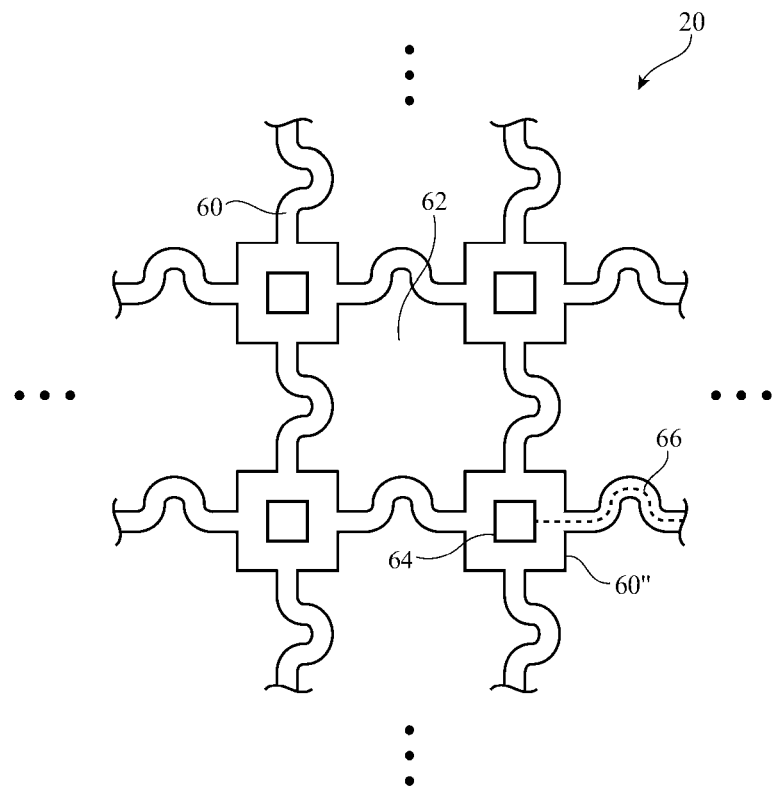
FIG. 4 is a diagram of an illustrative array of light-emitting diodes on a mesh shaped substrate in accordance with an embodiment.

In one illustrative configuration, edge illuminator 20 has a flexible substrate such as substrate 60 of FIG. 4. Substrate 60 may be a flexible polymer layer without openings and/or may be formed from a layer with openings such as openings 62 (e.g., to form a mesh shape for substrate 60). Substrate 60 may be formed from polyimide, an elastomeric material such as silicone, and/or other flexile substrate material. In the example of FIG. 4, openings 62 have been configured to form serpentine substrate segments that interconnect and array of square substrate islands 60" on which respective light-emitting devices 64 (e.g., one or more edge illuminator light-emitting diodes) have been mounted. Metal traces such as traces 66 may extend throughout substrate 60 to interconnect light-emitting devices 64. Islands 60" and light-emitting devices 64 may be organized in an array with rows and columns of fixed pitch and/or variable pitch and/or may be arranged in other patterns.

Figure 5:
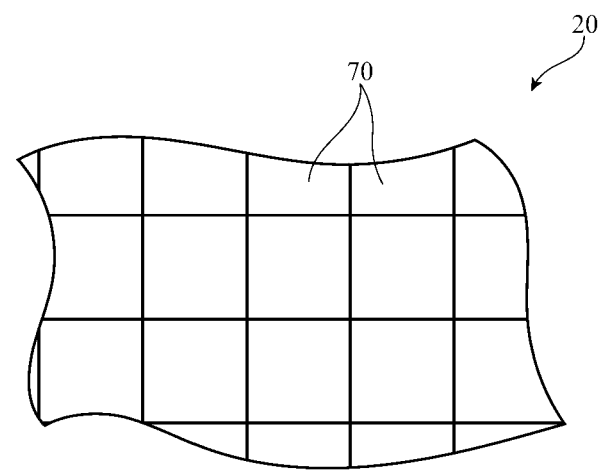
FIG. 5 is a diagram of an illustrative light-emitting component with pixels in accordance with an embodiment.

If desired, one or more light-emitting (or light-adjusting) cells such as cells 70 of FIG. 5 may form edge illuminator 20. Cells 70, which may sometimes be referred to as adjustable elements or pixels, may be electrically adjusted by control circuitry 16. The pitch (cell-to-cell spacing) of cells 70 may be fixed and/or variable. Cells 70 may be organic light-emitting diode elements, may be liquid crystal display element, may be electrophoretic display element, and/or may be other suitable individually controllable light-emitting (or light adjusting) components. Cells 70 may, if desired, be significantly larger than pixels 26 and arranged in a significantly coarser pattern (e.g., to reduce the overhead associated with forming and operating edge illuminator 20). One-dimensional and two-dimensional arrays of adjustable cells 70 may be formed, if desired.

FIG. 6 is a cross-sectional side view of edge illuminator 20 in an illustrative configuration in which edge illuminator 20 includes a light guide. As shown in FIG. 6, one or more light-emitting diodes 72 may emit light 74 into light guide 78. Light guide 78 may be a light guide layer formed from a rigid polymer plate or may be thin flexible light guide film. If desired, light guide 78 may have curved surfaces and/or other desired three-dimensional shapes. Light guide 78 may be formed from a transparent material, so that light 74 that has been emitted into light guide 78 may be distributed throughout light guide 78 in accordance with the principal of total internal reflection. Light-scattering features such as protrusions, recesses, and/or light-scattering particles in light guide 78 may be used to help extract light 74 (e.g., to form emitted light 80). Optional reflective structures such as reflector 76 may be used to help recycle light that has scattered from light guide 78 in a direction away from the desired direction of light emission.

In the example of FIG. 7, light guide 78 has an elongated shape with protrusions 78' into which light-emitting diodes 72 emit light 74. Other shapes may be used for light guide 78 if desired (e.g., shapes with curved surfaces such as surfaces with compound curvature, ring-shaped elongated structures, structures that extend along one or more edges of device 10 in elongated strips, etc.).

FIG. 8 is a cross-sectional side view of edge illuminator 20 in an illustrative configuration in which light 80 is emitted outwardly by light-emitting diodes 72 on printed circuit 84. Light-emitting diodes 72 are overlapped by member 82 (e.g., a transparent member such as a diffuser formed by embedding light-scattering particles into a polymer or other transparent material, fabric, material with perforations, etc.). The emitted light from light-emitting diodes 72 passes through member 82 to form emitted light 80.

FIG. 9 is a top view of an edge portion of device 10 that has been provided with an edge illuminator. Edge illuminator 20 of FIG. 9 has a one-dimensional array of light-emitting diodes 72 overlapped by optional structures such as a light guide, diffuser, etc. Light-emitting diodes 72 extend along the length of edge illuminator 20 in a one-dimensional array in the example of FIG. 9. If desired, light-emitting diodes 72 may be arranged in a two-dimensional array (see, e.g., FIG. 10) and/or there may be only one (or other small number) of light-emitting diodes 72 in edge illuminator 20. Light-emitting diodes 72 may include diodes of more than one color. For example, diodes 72 may include red diodes that emit red light, blue diodes that emit blue light, and/or green diodes that emit green light (as an example). Configurations in which diodes 72 include diodes of other colors (e.g., yellow, white, etc.) may also be used.

Figure 11:
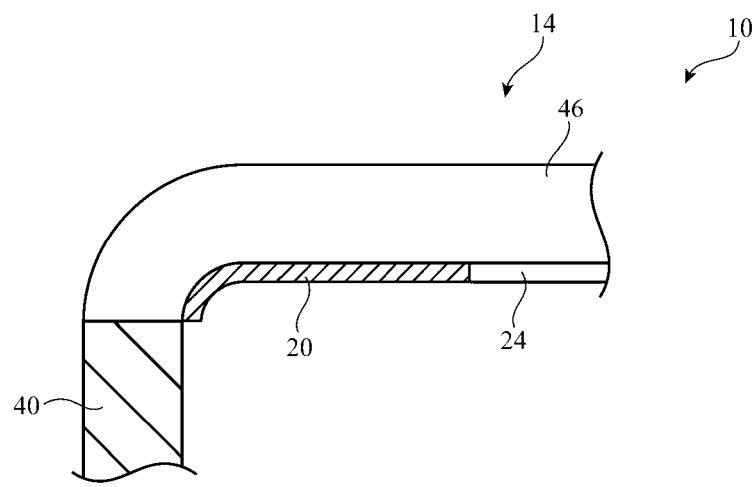
FIGS. 11, 12, 13, 14, and 15 are cross-sectional side views of illustrative electronic device edge portions in accordance with embodiments.

FIG. 11 is a cross-sectional side view of an edge portion of device 10 showing how edge illuminator 20 may be formed from a structure that bends and conforms to the curved inner surface of display cover layer 46 near the periphery of device 10 (e.g., the periphery of device 10 following a rectangular outline of front side F of device 10). Pixels 24 may be formed in an array with rows and columns on a substrate such as a flexible polyimide substrate (e.g., pixels 24 may be organic light-emitting diode pixels in an organic light-emitting diode display, etc.). In this type of configuration, the array of pixels 24 in display 14 may be bent or otherwise shaped to conform to a desired shape (e.g., to follow a curved cross-sectional profile for the inner surface of display cover layer 46 near the edge of display cover layer 46). Other portions of the substrate of display 14 may, for example, be planar and/or may have less curvature than the edges of display cover layer 46.

Figure 12:
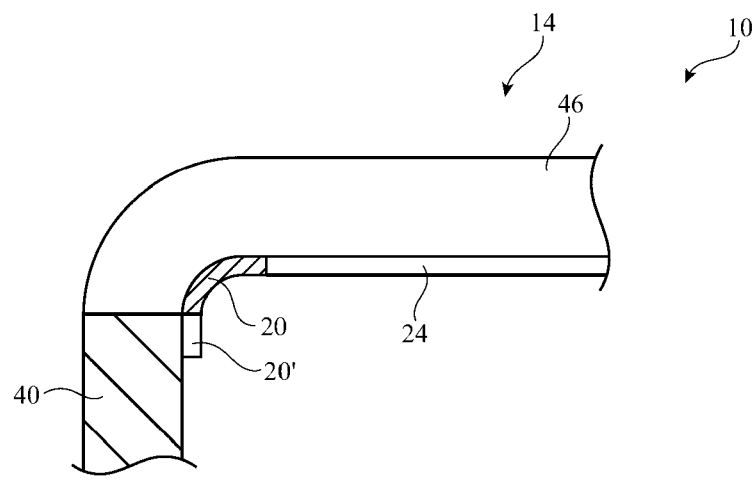

As shown in the example of FIG. 12, edge illuminator 20 may have a portion such as portion 20' that is overlapped by housing 40. In some configurations, portion 20' may include active light-emitting devices (e.g., light-emitting diodes). In these configurations, housing 40 may be formed from a transparent material that allows light from portion 20' to be emitted to the exterior of device 10 or may have openings (e.g., microperforations) that allow light to be emitted through housing 40. In other configurations, portion 20' may be free of light-emitting devices and may not emit light. In these configurations, portion 20' may include display driver circuitry, routing traces, and/or other non-light-emitting circuitry.

Figure 13:
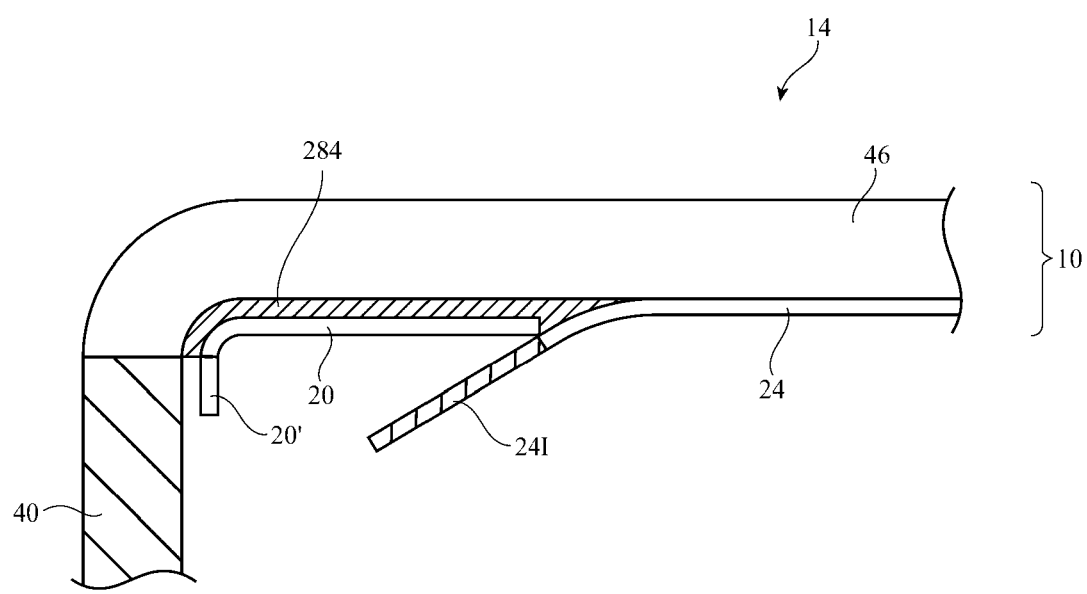

As shown in the illustrative arrangement of FIG. 13, edge illuminator 20 may overlap a portion of the substrate on which pixels 24 have been formed. Pixels 24 may, for example, be formed in an array on a polyimide substrate or other flexible substrate. Portion 241 of this substrate may contain display driver circuitry, metal traces for signal routing, encapsulation structures, and/or other structures that do not emit light. To allow light to be emitted along the edge of device 10, edge illuminator 20 may overlap portion 241, as shown in FIG. 13. Portion 20' of edge illuminator 20 may be mounted behind housing 40 and may, as described in connection with FIG. 12, contain active pixels or be free of pixels. To help reduce the visibility of the boundary between pixels 24 and edge illuminator 20, optional material 284 may be incorporated into device 10 between display cover layer 46 and edge illuminator 20 and/or pixels 24. Material 284 may, for example, be formed from a polymer (e.g., a polymer adhesive material). The polymer may be transparent to light emitted from edge illuminator 20 and pixels 24. If desired, light-scattering particles (e.g., titanium dioxide particles or other inorganic dielectric particles) may be incorporated into the polymer of material 284, thereby forming a diffuser layer that diffuses the light emitted from edge illuminator 20 and from overlapped pixels 24 along the boundary between pixels 24 and edge illuminator 20. In the example of FIG. 13, edge illuminator 20 is overlapping the substrate supporting pixels 24. If desired, pixels 24 and/or the substrate on which pixels 24 are formed may overlap edge illuminator 20. Arrangements in which pixels 24 and edge illuminator 20 are adjacent to each other without overlapping each other may also be used.

Figure 14:
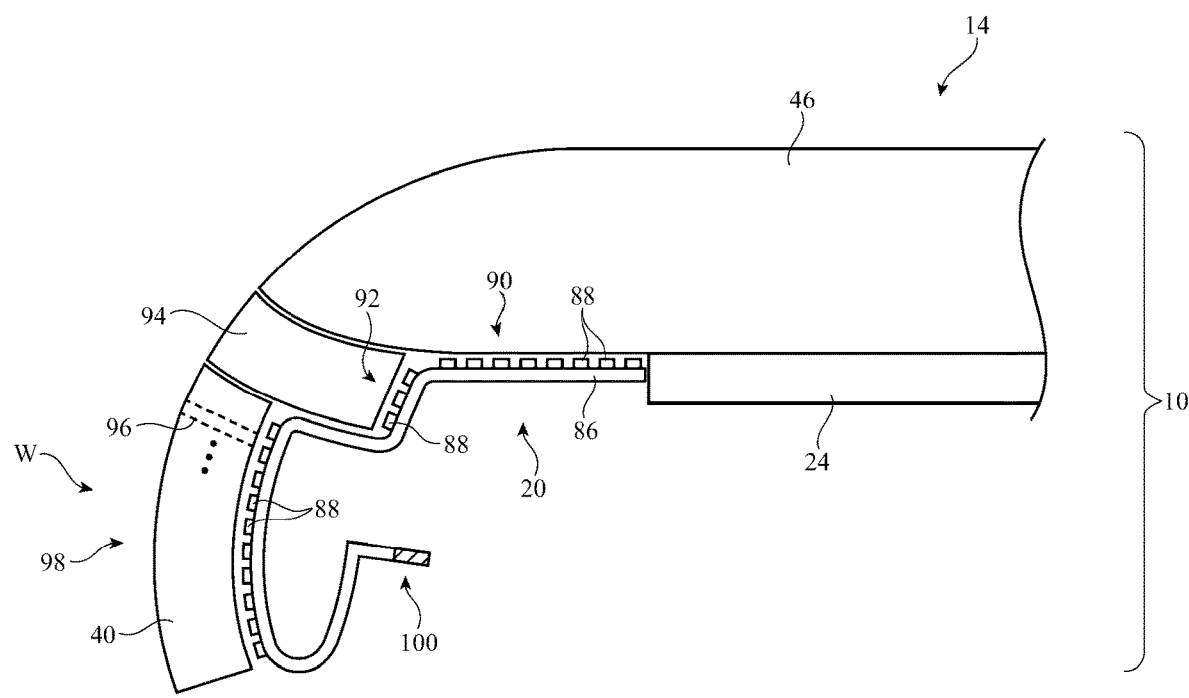

In the example of FIG. 14, edge illuminator 20 has a substrate such as substrate 86 (e.g., a mesh shaped substrate, a sheet of polymer, a substrate formed from elastomeric material such as an elastomeric mesh-shaped substrate, a mesh shaped sheet of polymer such as polyimide, and/or other flexible layer(s) of polymer material). Light-emitting diodes 88 or other electrically adjustable pixels may be formed on flexible substrate layer 86. In region 90, light-emitting diodes 88 may emit light through display cover layer 46 (e.g., to illuminate the edge region of device 10).

In region 92 of edge illuminator 20, light-emitting diodes 88 may emit light through member 94. Member 94 may be, for example, a frame member formed from a transparent polymer (e.g., a translucent polymer frame formed by embedding light-scattering particles in a clear polymer and/or by forming texture or other light-scattering features in member 94). This diffuse light-transmitting member may help illuminate portions of sidewall W.

Housing 40 may be present along the lower portion of sidewall W in region 98. If desired, housing 40 may be formed from an opaque material such as metal (e.g., stainless steel, aluminum or metal). Holes 96 may be formed in housing 40 to allow light from light-emitting diodes 88 in region 98 to be emitted through housing 40 for viewing by a user. Holes 96, which may sometimes be referred to as openings, perforations, or microperforations, may have any suitable shape and size. As an example, holes 96 may be laser-drilled openings (tapered or untampered cylindrical openings, etc.) having a maximum diameter of 20-150 microns, less than 100 microns, less than 60 microns, less than 30 microns, at least 10 microns, or other suitable size. Smaller holes (e.g., holes 96 with diameters of less than 60 microns or less than 30 microns) may be invisible to the naked eye, which may enhance the appearance of device 10).

As shown in FIG. 14, edge illuminator substrate 86 may be bent to accommodate the shape of the components of device 10. Substrate 86 may, for example, be bent to accommodate the differing orientations of the inner surfaces of display cover layer 46, member 94, and housing 40. End 100 or other portion of substrate 86 may be provided with contacts and/or a connector (e.g., conductive structures for mating with a zero insertion force connector or other suitable connector to allow the circuitry of edge illuminator 20 to be interconnected with control circuitry on a printed circuit board that is separate from substrate 86).

Figure 15:
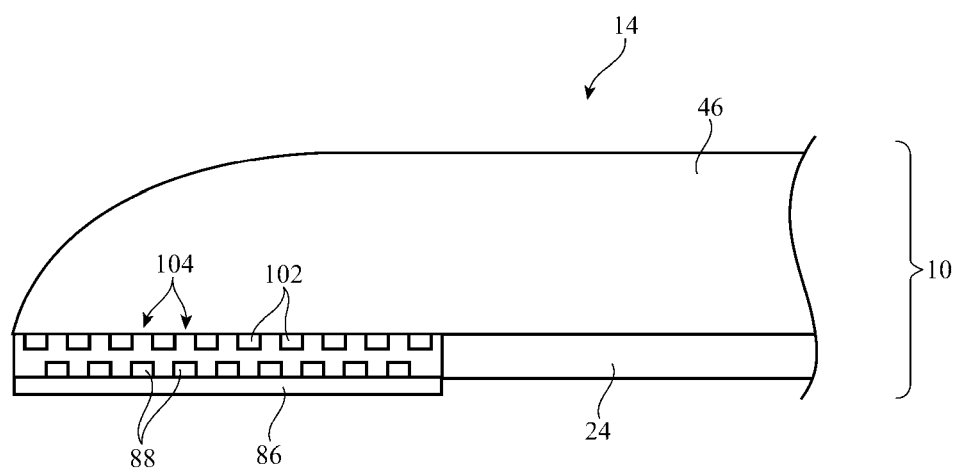

FIG. 15 is a cross-sectional side view of device 10 in an illustrative configuration in which the underside of the edge of display cover layer 46 has been provided with opaque masking material 102. Material 102 may have openings 104 that allow light from light-emitting diodes 88 in edge illuminator 20 to pass through the edge portion of display cover layer 46. Openings 104 may be aligned with respective light-emitting diodes 88 or there may be a different number of openings 104 than diodes 88. Openings 104 may be circular, square, rectangular, or hexagonal, or may have other shapes. If desired, edge illuminator 20 of FIG. 15 and the other FIGS. may have an illuminated light guide structure, adjustable electrophoretic display (e-ink) cells, and/or other adjustable components instead of using an array of individually adjustable light-emitting diodes 88 on substrate 86 or in addition to using an array of individually adjustable light-emitting diodes 88.

Figure 16:
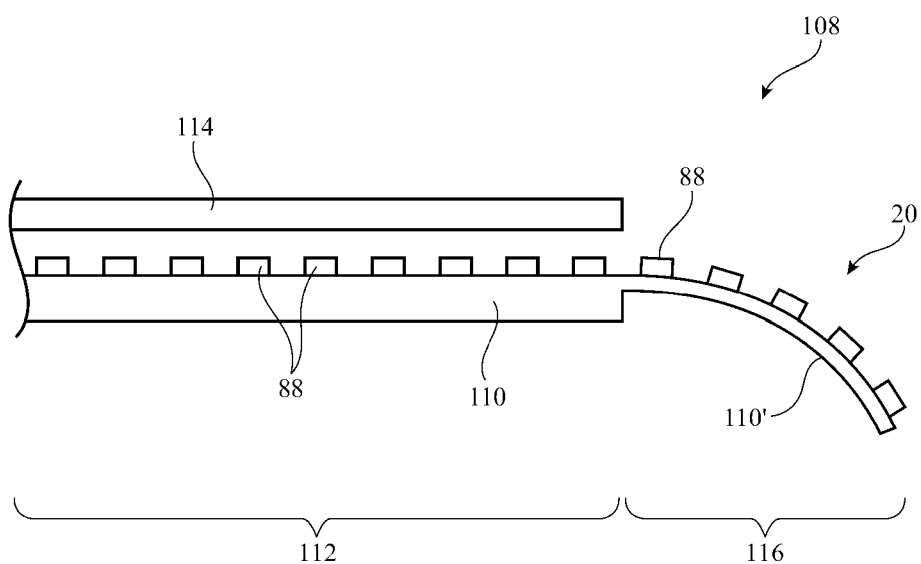
FIG. 16 is a cross-sectional side view of an illustrative backlit display and adjacent light-emitting diodes for an edge illuminator in accordance with an embodiment.

FIG. 16 is a cross-sectional side view of a backlit display system for device 10. System 108 of FIG. 16 may be mounted under a display cover layer with curved edges. System 108 of includes a backlight unit formed from light-emitting diodes 88 on substrate 110 in region 112. The light-emitting diodes 88 in region 112 provide backlight illumination that passes through an array of pixels (pixel array 114). Pixel array 114 may be a liquid crystal display pixel array or other pixel array that has pixels 24 for displaying images for the user. Display cover layer 46 may overlap pixel array 114 on front side F of device 10.

Substrate 110 may be a rigid flex printed circuit. The central portion of substrate 110 in region 112 may be formed from rigid printed circuit material (e.g., fiberglass-filled epoxy or other rigid printed circuit substrate material). In edge region 116 of device 10, a flexible printed circuit layer of substrate 110 such as flexible substrate portion 110' of substrate 110 may protrude from the rigid portion of substrate 110 in region 112. The flexible printed circuit layer may be formed from a flexible printed circuit substrate material such as a flexible layer of polyimide or other sheet of flexible polymer. Light-emitting diodes 88 on flexible substrate portion 110' may form edge illuminator 20.

If desired, the printed circuit formed from substrate 110 and flexible substrate portion 110' may be used for routing signals to pixel array 114. For example, data lines, power lines, control signal paths, and/or other signal paths may pass under the light-emitting diodes 88 in region 112 that are being used to provide backlight illumination for the pixels of pixel array 114. Along one or more of the edges of pixel array 114 and/or using vias that protrude into the substrate of pixel array 114 from below, these signal paths may be coupled to the signal paths of pixel array 114 to provide pixel array 114 with image data, to gather touch data from touch sensors in array 114 and/or that overlap array 114, etc.

Figure 17:
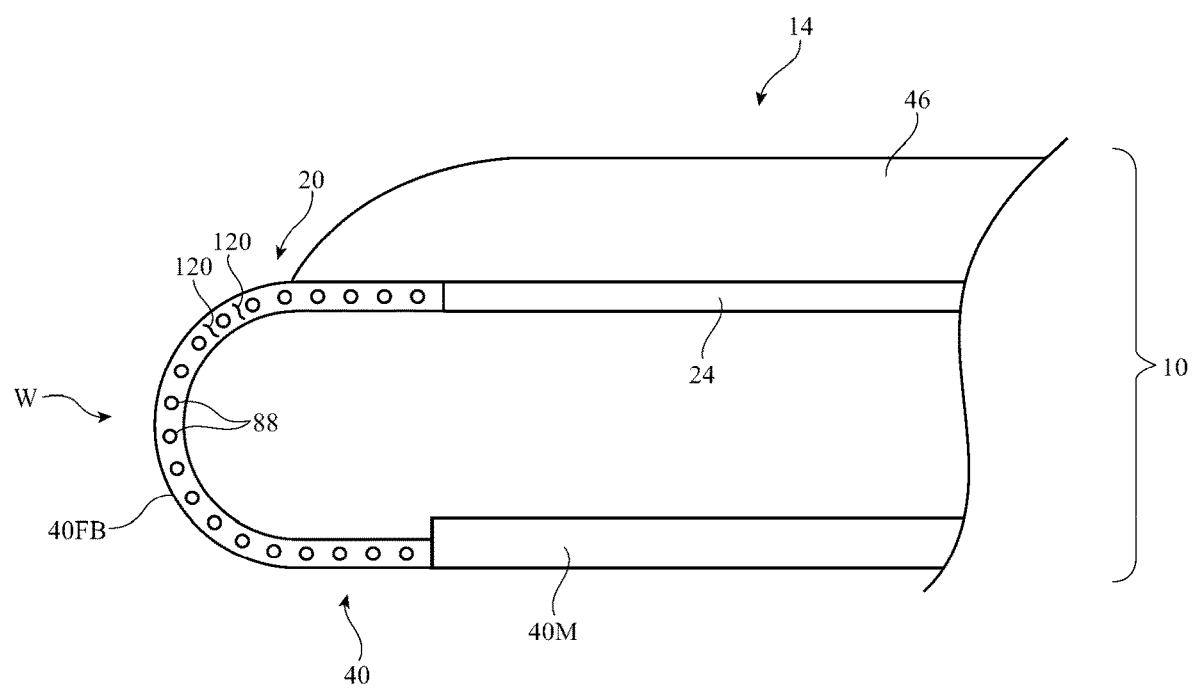
FIG. 17 is a cross-sectional side view of an illustrative electronic device with a housing structure formed from illuminated fabric in accordance with an embodiment.

FIG. 17 is a cross-sectional side view of device 10 in an illustrative configuration in which housing 40 includes a fabric portion such as portion 40FB. Portion 40FB may be, for example, a woven fabric, knit fabric, or braided fabric. Portion 40FB may be formed from one or more layers of fabric having intertwined strands 120. Strands 120 may be bare metal wires, may have metal portions (e.g., metal cores and/or metal coatings) and dielectric portions (dielectric cores and/or coatings), may be formed from monofilaments and/or threads with multiple monofilaments, and/or may be other suitable strands with conductive materials for forming signal paths. These signal paths and/or metal traces on fabric 40FB and/or on a flexible printed circuit or other substrate may be used in providing signals to light-emitting diodes 88. In some configurations, light-emitting diodes 88 may be coupled to conductive strands in fabric 40FB and may be embedded within fabric 40FB.

If desired, fabric 40FB may have openings (perforations or other spaces between strands) that allow light from light-emitting diodes 88 to pass through fabric 40FB (e.g., in an arrangement in which fabric 40FB overlaps a printed circuit or other substrate on which light-emitting diodes 88 have been mounted). By providing individually adjustable light-emitting diodes 88 under fabric 40FB, light-emitting diodes 88 form an edge illuminator 20 for device 10 and allow text, icons, and other content may be displayed on sidewall W of device 10. If desired, light for fabric 40FB (and edge illuminator 20 of FIG. 17) may be provided using an illuminated light guide or other light source. The use of an array of light-emitting diodes 88 in the arrangement of FIG. 17 is illustrative.

Figure 18:
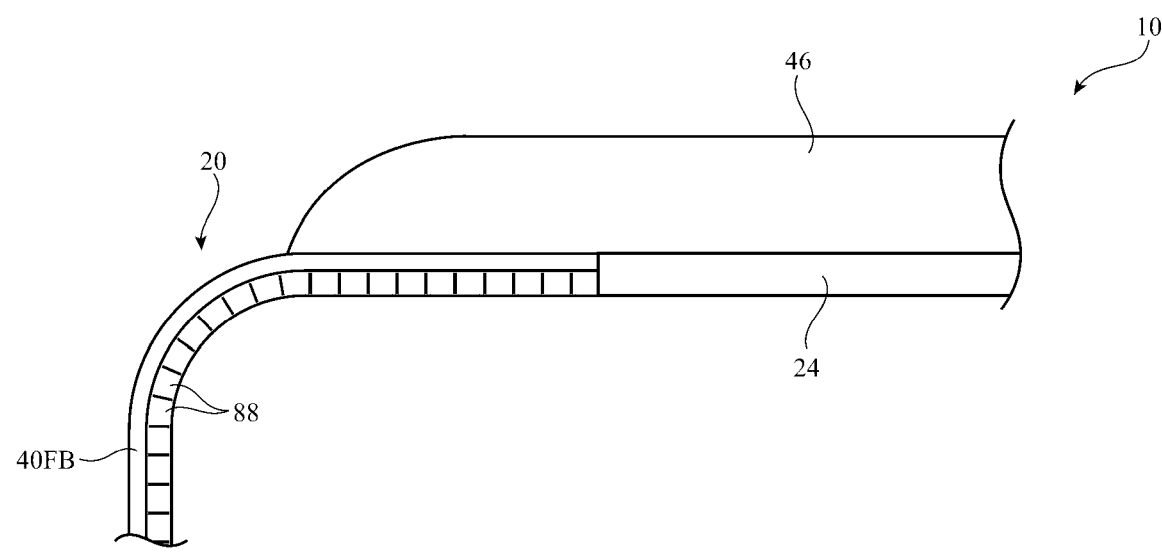
FIG. 18 is a cross-sectional side view of an edge portion of an electronic device in which a layer of material such as a layer of fabric overlaps light-emitting components in accordance with an embodiment.

FIG. 18 is a cross-sectional side view of an edge portion of device 10 in an illustrative configuration in which fabric 40FB is incorporated into sidewall W of device 10. In the example of FIG. 18, fabric 40FB overlaps one or more light-emitting diodes 88 in edge illuminator 20. Fabric 40FB of FIG. 18 may be incorporated into a sidewall of device 10. Device 10 may also include display cover layer 46 and pixels 24. If desired, display cover layer 46 and pixels 24 may be omitted (e.g., fabric 40FB and light-emitting diodes 88 may be used in forming sidewalls and/or rear walls or other portions of a removable cover for device 10 rather than a portion of device 10).

Figure 19:
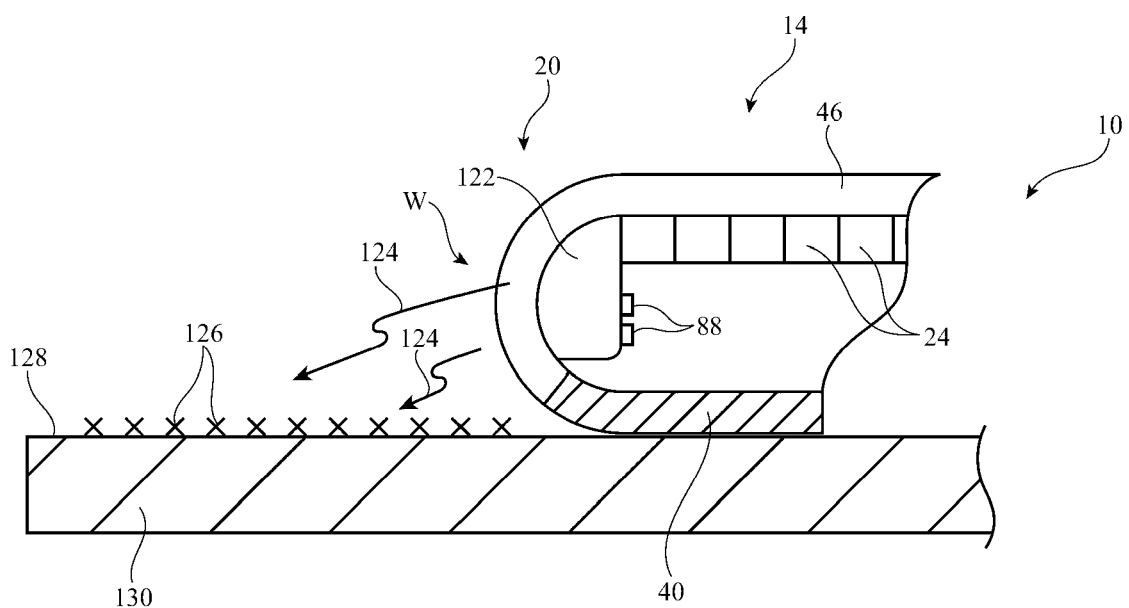
FIG. 19 is a cross-sectional side view of an illustrative electronic device with an illumination system that illuminates a surface on which the electronic device is resting in accordance with an embodiment.

In the example of FIG. 19, device 10 is resting on support surface 128 of support structure 130. Support structure 130 may be a table or other external object that supports device 10. Pixels 24 may be overlapped by display cover layer 46. Display cover layer 46 or transparent portions of housing 40 on sidewall W of device 10 may allow light 124 from light-emitting diodes 88 to be projected onto surface 128 to form projected light 126. If desired, light from light-emitting diodes 88 may pass through member 122 (e.g., a transparent member formed from polymer with light-scattering structures such as embedded light-scattering particles or texture that allow member 122 to serve as a diffuser). In this type of arrangement, projected light 126 may have a diffuse glowing appearance. In general, any suitable light emitted by light-emitting diodes 88 in edge illuminator 20 may be projected onto nearby external surfaces.

Figure 20:
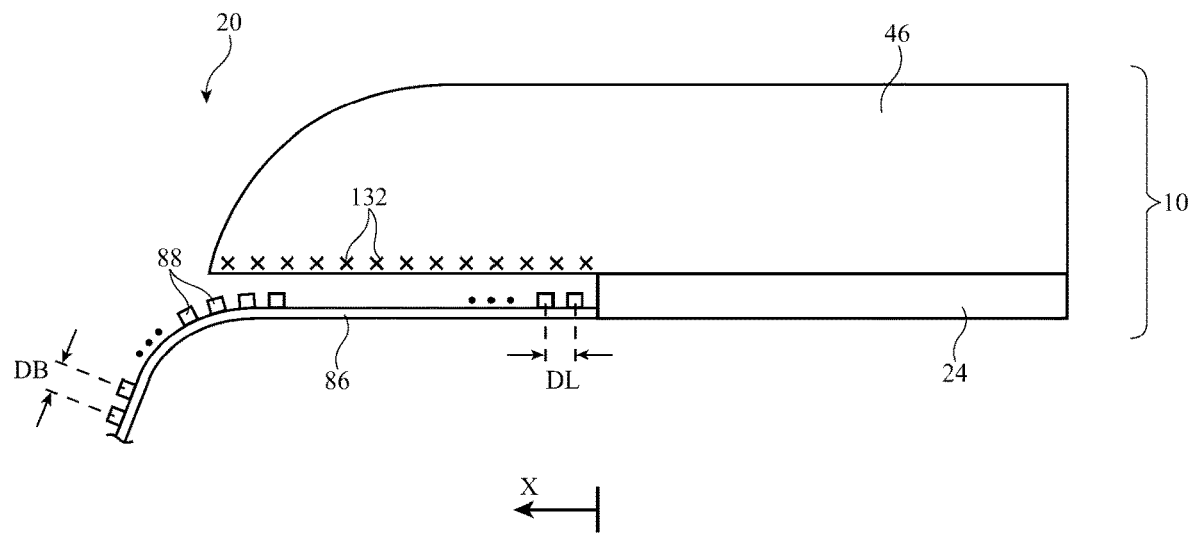
FIG. 20 is a cross-sectional side view of an edge of an illustrative electronic device in which structures such as edge illuminator structures have an attribute that is varied as a function of distance from the edge of the device in accordance with an embodiment.

FIG. 20 is a cross-sectional side view of an illustrative edge portion of device 10. As shown in FIG. 20, edge portion 132 of display cover layer 46 may be modified (e.g., to create texture or to incorporate light-scattering particles to create haze, etc.). Light-emitting diodes 88 of edge illuminator 20 may be mounted on substrate 86 to create illumination for the edge portions of device 10.

As shown in FIG. 20, light-emitting diodes 88 may be mounted on substrate 86 with a pitch that varies as a function of distance X away from pixels 24 (and therefore as a function of distance from the periphery of device 10). For example, near to pixels 24 (and far from the outer edge of device 10), adjacent light-emitting diodes 88 may be separated by a distance (light-emitting-diode-center-to-light-emitting-diode-center spacing) DL, whereas far from pixels 24 (and near the outermost peripheral edge of device 10), adjacent light-emitting diodes 88 may be separated by a distance DB that is different than DL. The diode spacing for diodes 88 may, for example, increase or decrease linearly, increase or decrease in a stepwise fashion, increase or decrease exponentially, may fluctuate, and/or may vary in accordance with any other continuously or discretely varying function.

Other attributes of the components and structures in edge illuminator 20 may also be varied as a function of distance X. For example, opaque masking material on the inner surface of layer 46 may have openings that vary in density as a function of distance X, may have a thickness that varies as a function of distance X, may have a transparency that varies as a function of distance X, and/or may have other attributes that vary as a function of distance. The profile shape, opacity, haze, and/or other attributes of display cover layer 46 may vary as a function of distance X, the color, pitch, light-output capabilities and/or other attributes of light-emitting diodes 88 may vary as a function of distance X, the attributes of a photoluminescent material (e.g. a phosphor) that covers some or all of light-emitting diodes 88 may be varied as a function of distance X, the haze, opacity, color, thickness, and/or other attributes of and adhesive layer that is interposed between diodes 88 and overlapping structures (display cover layer 46 and/or housing 40) may be varied as a function of distance X, and/or other attributes of the components and structures of edge illuminator 20 may be varied as a function of distance X (and therefore as a function of distance from the outer edge of device 10).

Figure 21:
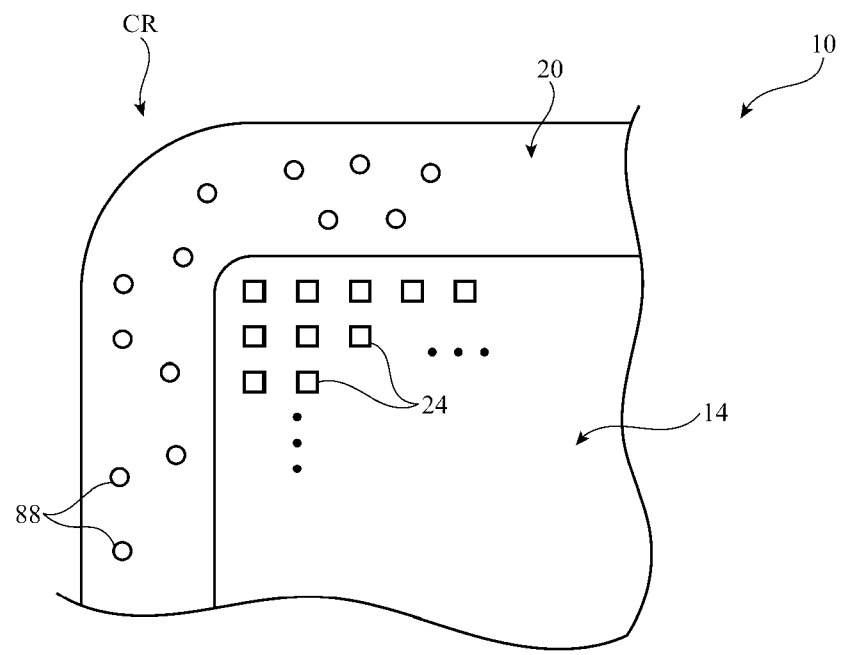
FIG. 21 is a top view of an illustrative electronic device with a display with an illuminated border and corner in accordance with an embodiment.

FIG. 21 is a top view of device 10 in an illustrative configuration in which the center of device 10 has an array of pixels 24 to form display 14 and in which edge illuminator 20 surrounds the periphery of pixels 24. Edge illuminator 20 may have one or more light-emitting diodes 88 and these components may be arranged with a different pattern pitch (e.g., a coarser pitch) than pixels 24. If desired, light-emitting diodes 88 may be formed on flexible elastomeric substrates or other substrates that allow edge illuminator 20 to accommodate compound curvature in the surfaces of display cover layer 46 at the corners of device 10 such as corner CR.

Figure 22:
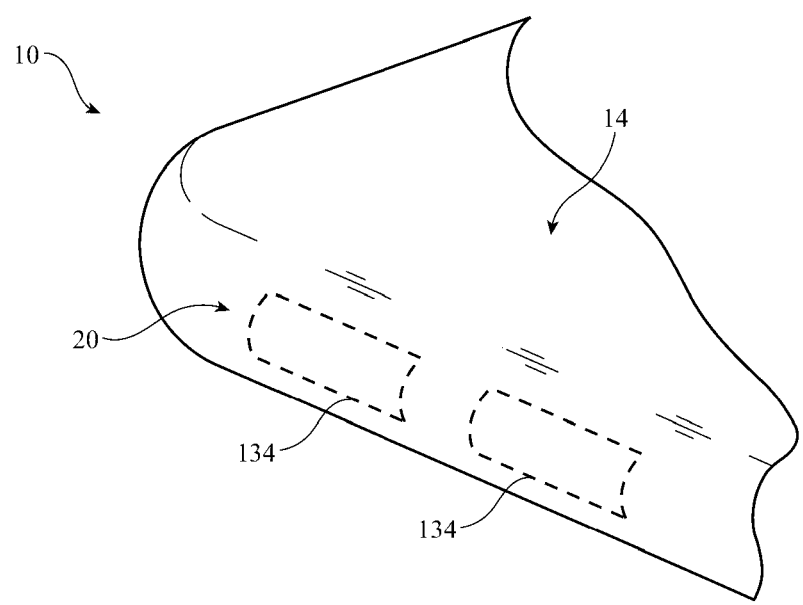
FIG. 22 is a perspective view of an illustrative edge portion of an electronic device showing how the edge portion may display content in accordance with an embodiment.

As shown in FIG. 22, edge illuminator 20 may, if desired, use light-emitting diodes 88 or cells formed from electrophoretic display structures and/or other adjustable components to form visual content 134. Content 134 may include diffuse light, patterns of diffuse light, text, icons, still and/or moving images, images with a lower or higher resolution than the images displayed by pixels 24 in display 14, and/or other content. Diffuse light and/or other lower-resolution content may be displayed in coordination with the content on pixels 24 of display 14. For example, in an example in which edge illuminator 20 has a single solid color that extends in an unbroken ring around display 14, this color may be selected to match the average color of the image on display 14, may be selected to match the average intensity of the image on display 14, may have a different color and/or intensity that coordinates with the attributes of the image on display 14, and/or may have a fixed intensity and/or color that is displayed whenever content is displayed on display 14. In arrangements in which edge illuminator 20 has multiple individually adjustable areas, these areas may be adjusted to match the intensity and/or color of nearby portions of the image on display 14 and/or may be adjusted to create text, icons, and/or other patterns of visual content. Edge illuminator 20 may also produce illumination that is indicative of incoming messages, expiration of timers (alarms), and/or other events that may or may not be associated with content on display 14.

Figure 23:
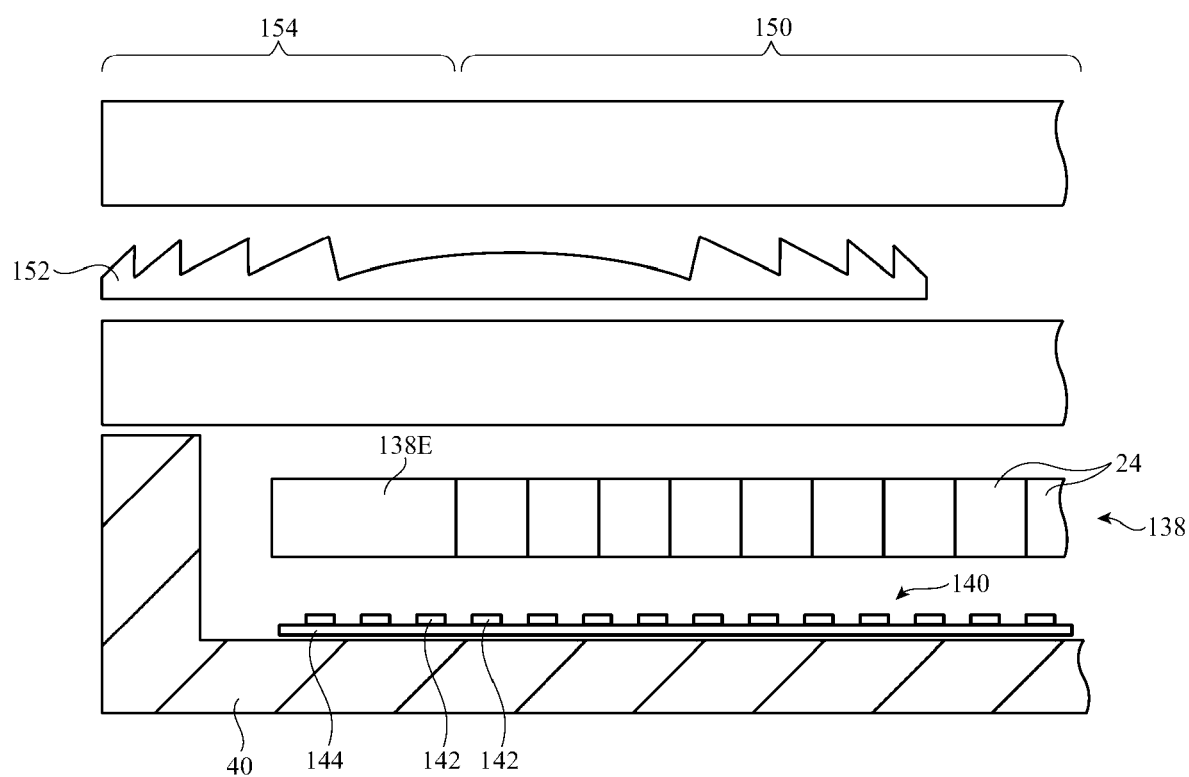
FIG. 23 is a cross-sectional side view of an illustrative electronic device with a Fresnel lens structure in accordance with an embodiment.

FIG. 23 is a cross-sectional side view of device 10 in an illustrative configuration in which device 10 has a Fresnel lens. Display 14 of device 10 may have an array of pixels 24 formed from liquid crystal display module 138 and may receive backlight illumination from backlight 140. Backlight 140 may have an array of light-emitting diodes 142 that are mounted on printed circuit 144. In area 150 of device 10, pixels 24 in display module 138 are adjusted to display images for display 14 and these images are backlit by light-emitting diodes 142 in backlight 140. Edge portion 138I of display module 138 does not contain pixels 24, but is sufficiently transparent to allow some of the backlight emitted by light-emitting diodes 142 to be emitted through display cover layer 46. To help obscure the border between pixels 24 in module 138 and inactive area 138I, Fresnel lens structures 152 may overlap pixels 24 adjacent to this border and may overlap inactive area 138I. If desired, Fresnel lens structures 152 may be formed on the underside of display cover layer 46 (e.g., as a separate layer of optical structures or as an integral portion of display cover layer 46). During operation, diffuse light (e.g., light that has passed through Fresnel lens structures 152) may illuminate edge region 154 of display cover layer 46 and the adjacent edge of region 150.

Figure 24:
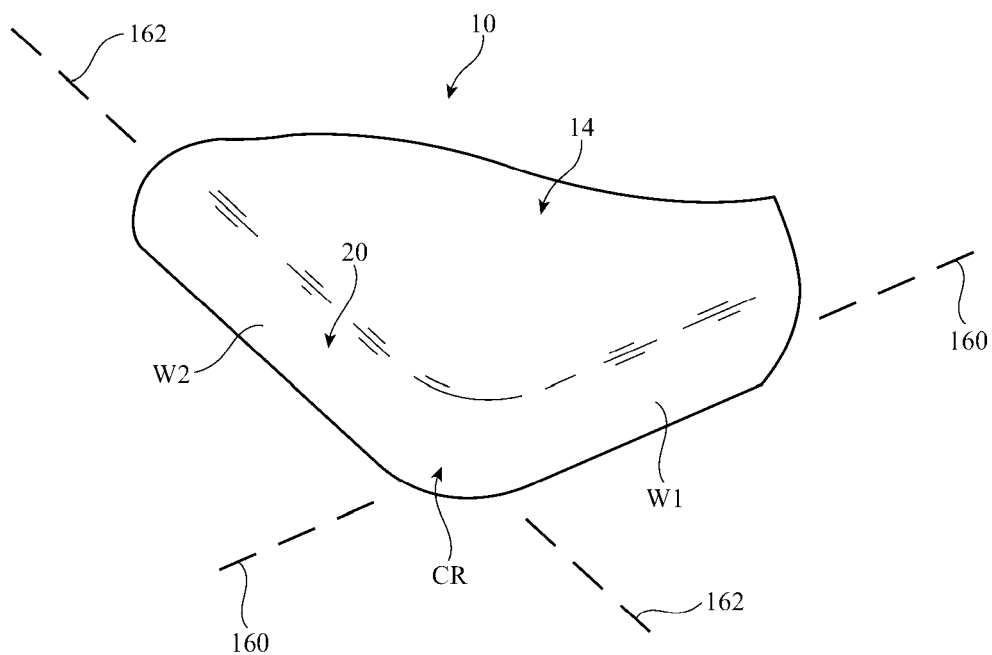
FIG. 24 is a perspective view of a corner of an illustrative electronic device in accordance with an embodiment.

FIG. 24 is a perspective view of an illustrative corner portion of device 10 showing how the surface of corner CR may have compound curvature (e.g., a surface that can only be flattened into a plane with distortion, sometimes referred to as a surface with Gaussian curvature). Each of the four corners of device 10 may have this arrangement, if desired. Edge illuminator 20 may illuminate the surface of corner CR and adjacent curved surfaces running along the sides of device 10. For example, edge illuminator 20 may illuminate sidewall portion W1 and sidewall portion W2. Sidewall portion W1 may, if desired, have a curved cross-sectional profile and may curve around axis 160. Sidewall portion W2 may have a curved cross-sectional profile that curves about axis 162. These sidewall surfaces may lie flush with an adjacent surface with compound curvature at corner CR. Edge illuminator 20 may supply light to the edge portions of device 10 surrounding display 14 including four sidewalls such as sidewalls W1 and W2 and four corners such as corner CR.

Figure 25:
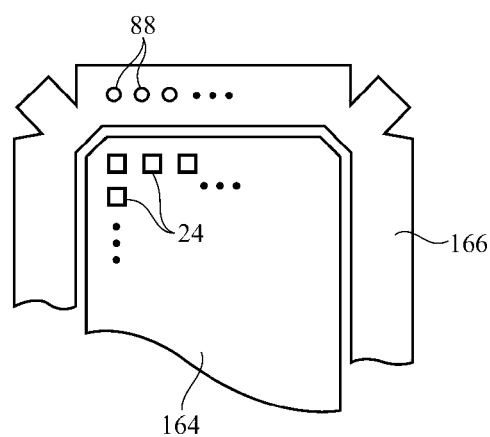
FIG. 25 is a top view of illustrative structures that may be used in the electronic device of FIG. 24 in accordance with an embodiment.

FIG. 25 is a top view of structures that may be used in forming device 10 of FIG. 24. Central display structure 164 may be a display such as a display having an array of light-emitting diodes or other pixels 24 (e.g., a flexible display such as an organic light-emitting diode display or a liquid crystal display). Flexible edge illuminator layer 166 may be formed from a flexible substrate (e.g., an elastomeric substrate and/or other flexible substrate layer such as a layer of polyimide) and may be patterned in a ring-shaped strip with tabs and corner protrusions that can be curved downward to cover sidewalls such as sidewalls W1 and W2 of FIG. 24 and curved corner portions CR of FIG. 24. Light-emitting diodes 88 (e.g., thin-film organic light-emitting diodes and/or light-emitting diodes formed from crystalline semiconductor dies) may be formed on layer 166 to provide illumination for edge illuminator 120 when layer 166 is bent into a desired shape (e.g., a shape that allows layer 166 to cover the sidewalls and corners of FIG. 24).

Figure 26:
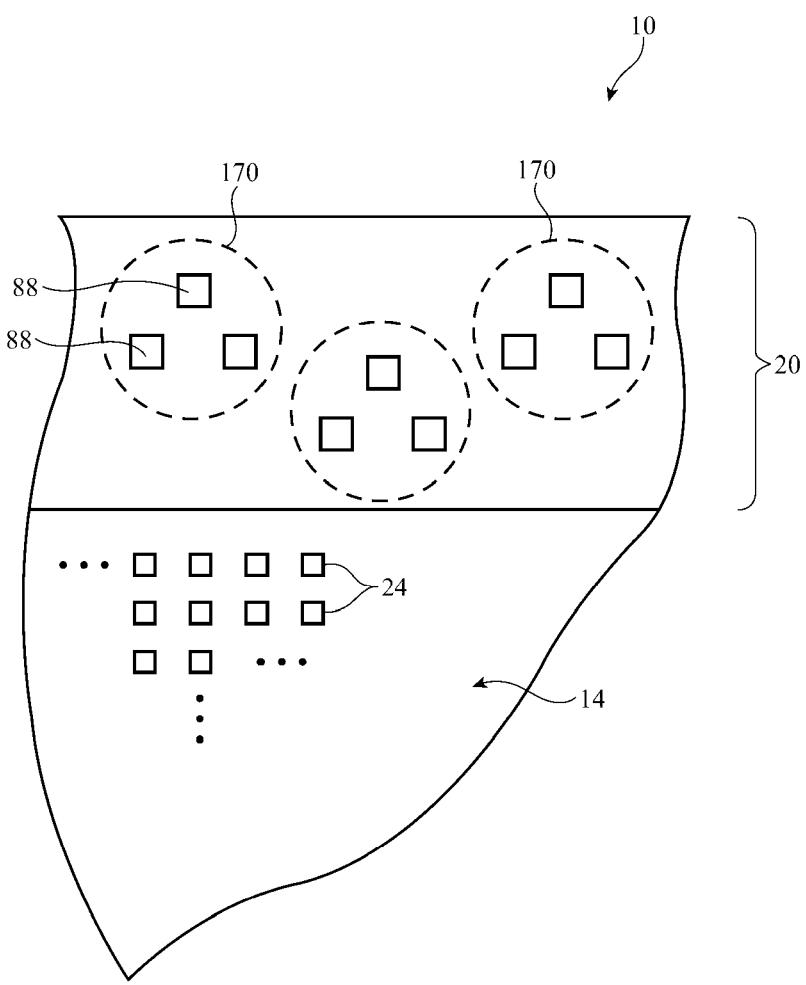
FIG. 26 is a top view of an illustrative electronic device with a display and an illuminated border in accordance with an embodiment.

As shown in FIG. 26, light-emitting devices 170 in edge illuminator 120 may be formed from clusters of light-emitting diodes 88. Each light-emitting device 170 may, for example, include a red light-emitting diode 88, a green light-emitting diode 88, and a blue light-emitting diode 88. Pixels 24 in the array of pixels formed in display 14 may have a smaller pixel-to-pixel spacing than light-emitting devices 170. There may, for example, be at least 200 or at least 300 pixels per inch in the array of pixels 24 of display 14, whereas there may be fewer than 100 pixels (devices) per inch, fewer than 30 pixels per inch, fewer than 10 pixels per inch, at least 1 pixel per inch, or at least 5 pixels per inch in edge illuminator 120 (as an example).

Figure 27:
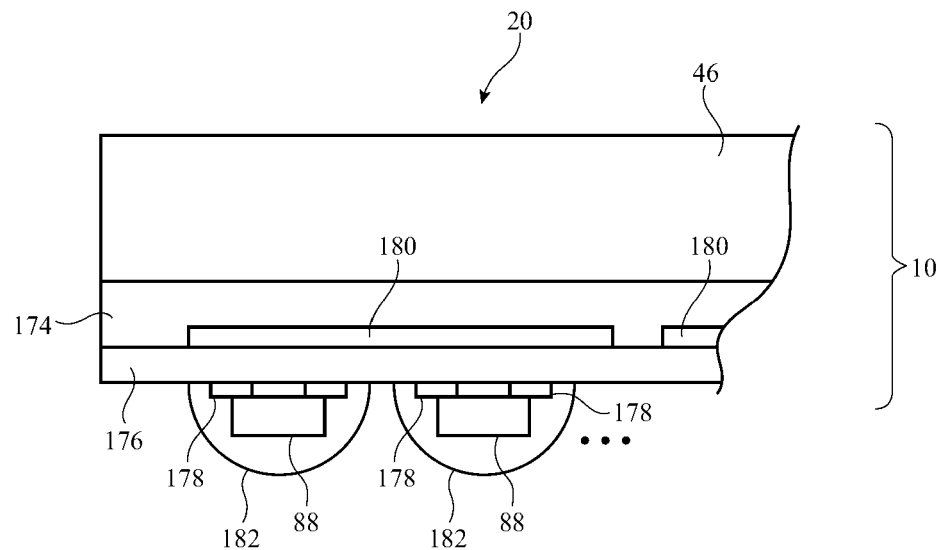
FIG. 27 is a cross-sectional side view of an illustrative edge portion of an electronic device that is illuminated using light-emitting diodes covered with photoluminescent material in accordance with an embodiment.

FIG. 27 is a cross-sectional side view of device 10 in an illustrative configuration in which photoluminescent material 182 overlaps light-emitting diodes 88 in edge illuminator 20. Photoluminescent material 182 may be, for example, a phosphor. Light-emitting diodes 88 may be configured to emit light of a given color (e.g. blue light) in one or more directions (up, down, and/or sideways). Photoluminescent material 182 may be configured to luminesce (e.g., to emit light of another color such as white light) in response to being illuminated with the light of the given color. A layer of photoluminescent material 182 may cover each of light-emitting diodes 88 or separate portions of material 182 may cover respective light-emitting diodes 88 as shown in FIG. 27. Light-emitting diodes 88 may be mounted to a transparent substrate layer such as substrate 176 and may be coupled to conductive traces 178 on substrate 176. Substrate 176 may be, for example, a clear polymer layer and traces 178 may be transparent conductive traces such as indium tin oxide traces formed on an inner surface of substrate 176. If desired, transparent conductive traces 180 (e.g., indium tin oxide traces) may also be formed on an opposing outer surface of substrate 176, facing display cover layer 46. Traces 180 may, for example, be capacitive touch sensor electrodes. Optically clear adhesive 174 may be used to couple substrate 176 and light-emitting diodes 88 to the inner surface of display cover layer 46.

Figure 28:
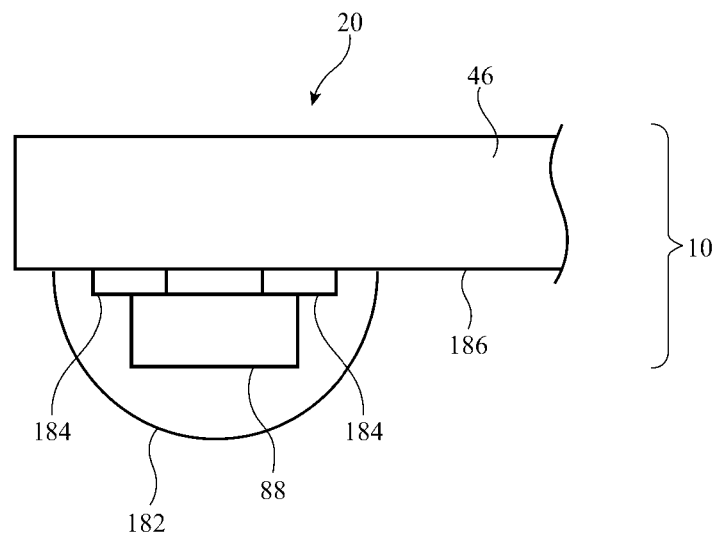
FIG. 28 is a cross-sectional side view of an illustrative edge portion of an electronic device with a light-emitting diode mounted on the inner surface of a display cover layer in accordance with an embodiment.

In another illustrative configuration, transparent conductive traces such as traces 184 of FIG. 28 may be formed directly on inner surface 186 of display cover layer 46 (or on a coating on inner surface 186). Light-emitting diodes 88 may then be mounted to traces 184. In arrangements in which light-emitting diodes 88 are coupled to metal traces in device 10, solder, conductive adhesive, and/or other conductive material may be used in forming electrical and mechanical joints between contacts on light-emitting diodes 88 and associated contacts formed from the metal traces. As shown in FIG. 28, photoluminescent material 182 may be formed over light-emitting diodes 88, if desired.

Figure 29:
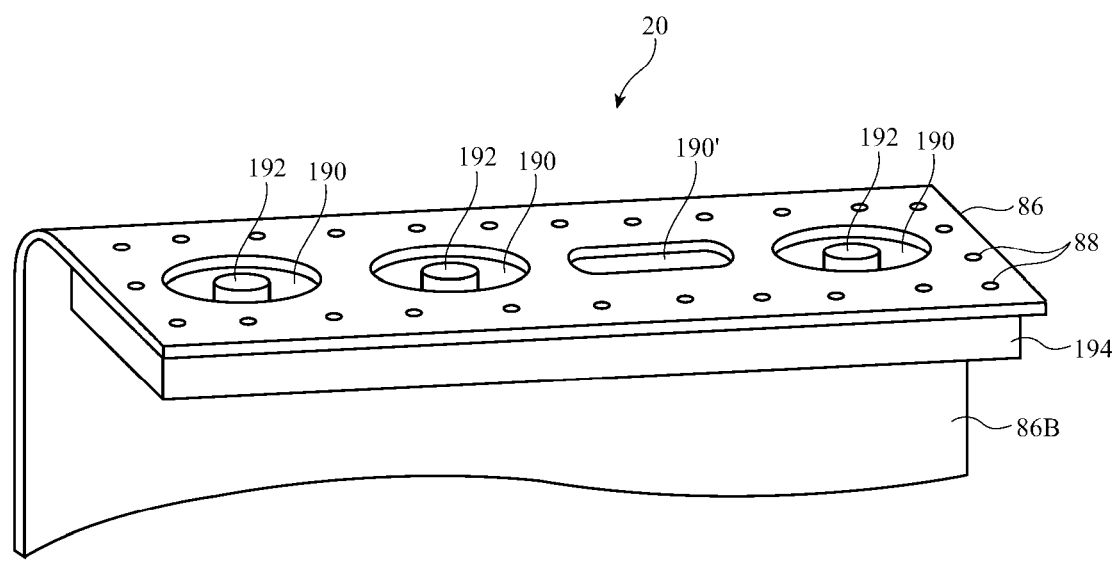
FIG. 29 is a perspective view of an edge illuminator for an edge portion of an electronic device in accordance with an embodiment.

FIG. 29 is a perspective view of edge illuminator 20 in an illustrative configuration in which openings have been formed in a substrate for edge illuminator 20. As shown in FIG. 29, edge illuminator 20 may have a substrate such as substrate 86. Substrate 86 may be formed from a flexible polymer (e.g., a flexible sheet of polyimide or other flexible polymer layer, a substrate material such as silicone or other elastomeric polymer, a mesh-shaped substrate, etc.). Light-emitting diodes 88 may be mounted to metal traces on substrate 86. Optional light-diffusing polymer may cover layer 86, if desired. A metal bracket or other support structure 194 may support light-emitting diodes 88 in a desired position for emitting light for edge illuminator 20. For example, support structure 194 may hold light-emitting diodes 88 in a location aligned with notch N of FIG. 2 (as an example). To accommodate components in device 10, substrate 86 may have openings such as openings 190 and 190'. Openings 190 may form optical component window for optical components that are aligned with openings 190 such as an ambient light sensor, an infrared proximity sensor, a visible light camera, an infrared camera, a flood illumination light-emitting diode (e.g., an infrared light-emitting diode), an array of laser-diodes (e.g., infrared vertical cavity surface emitting diodes for emitting an array of light beams in a structured light sensor that also includes the infrared camera), and/or other optical components. Opening 190' may be aligned with an internal component in device 10 such as a speaker. If desired, substrate 86 may have a rear bent portion such as portion 86B that carries signal paths for coupling light-emitting diodes 88 to control circuitry 16 located elsewhere in device 10. Light-emitting diodes 88 may be mounted in an outwardly-facing orientation on portion 86B.

Figure 30:
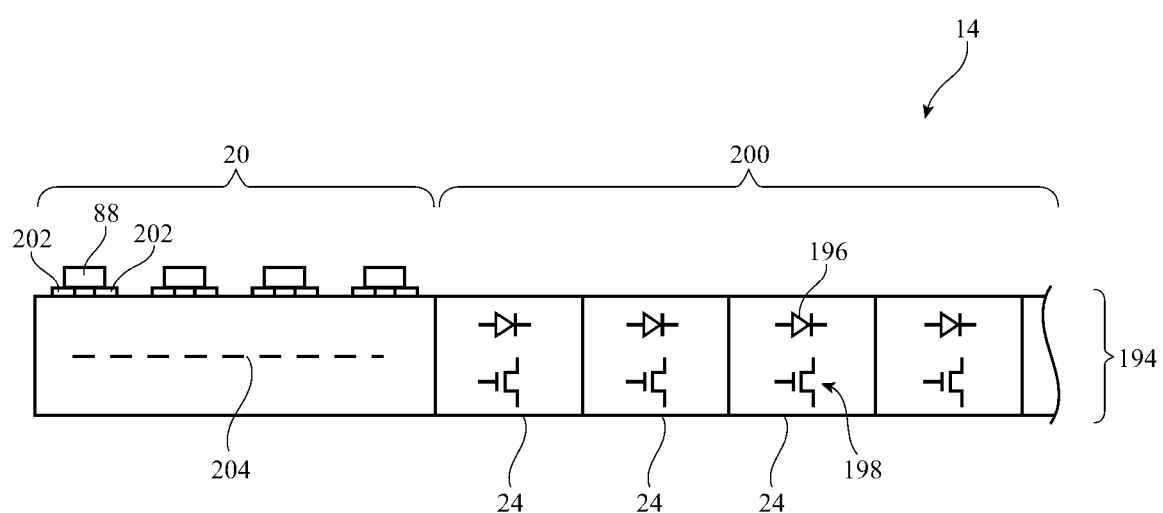
FIG. 30 is a cross-sectional side view of an illustrative display layer having thin-film structures that form an array of pixels and having a border region in which edge illuminator light-emitting diodes are mounted to a surface of the display layer in accordance with an embodiment.

In the example of FIG. 30, display 14 includes a substrate such as substrate 194. Substrate 194 may include a layer of polyimide or other flexible polymer and thin-film layers (dielectric thin films, thin-film layers of metal and/or semiconductor, encapsulant, etc.). The thin-film layers may form thin-film light-emitting diodes 196 (e.g., organic light-emitting diodes) and thin-film transistors 198 for pixel circuitry in each pixel 24. In region 200 of display 14, pixels 24 display an image for a user of device 10. Along peripheral edge portions of substrate 194, traces 204 in substrate 194 may route signals (data, power, etc.) for pixels 24. Some metal traces in this portion such as traces 202 may form solder pads or other surface contacts that supply signals to light-emitting diodes 88 that are mounted on the upper surface of substrate 194. In this way, light-emitting diodes 88 for edge illuminator 20 (e.g., diodes formed from crystalline semiconductor light-emitting diode dies) may be supported by the same substrate (substrate 194) that is used in forming the array of pixels 24 for display 14.

Figure 31:
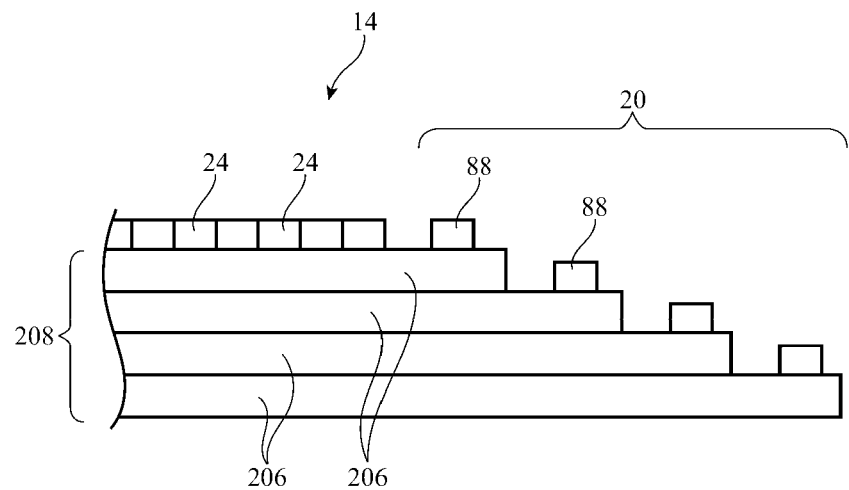
FIG. 31 is a cross-sectional side view of an illustrative display overlapping a printed circuit having layers of staggered lengths on which light-emitting diodes are mounted to form an illuminated display border with a curved cross-sectional profile in accordance with an embodiment.

FIG. 31 is a cross-sectional side view of display 14 in an illustrative configuration in which edge illuminator 20 is formed from light-emitting diodes 88 that are mounted to different respective layers 206 in printed circuit 208 (e.g., a rigid printed circuit board formed from a rigid printed circuit board substrate material such as fiberglass-filled epoxy). Layers 206 may be laminated to each other with adhesive (as an example) and may have different lengths so that light-emitting diodes 88 are mounted at different heights within edge illuminator 20 (e.g., so that illuminator 20 can be provided with a curved profile that matches the curved inner surface profile of display cover layer 46, etc.). Display 14 may be formed from an array of pixels 24 mounted on an upper surface of printed circuit 208. Pixels 24 may, for example, be formed in a flexible organic light-emitting diode display layer that is attached to the upper surface of printed circuit 208 using a layer of adhesive.

Figure 32:
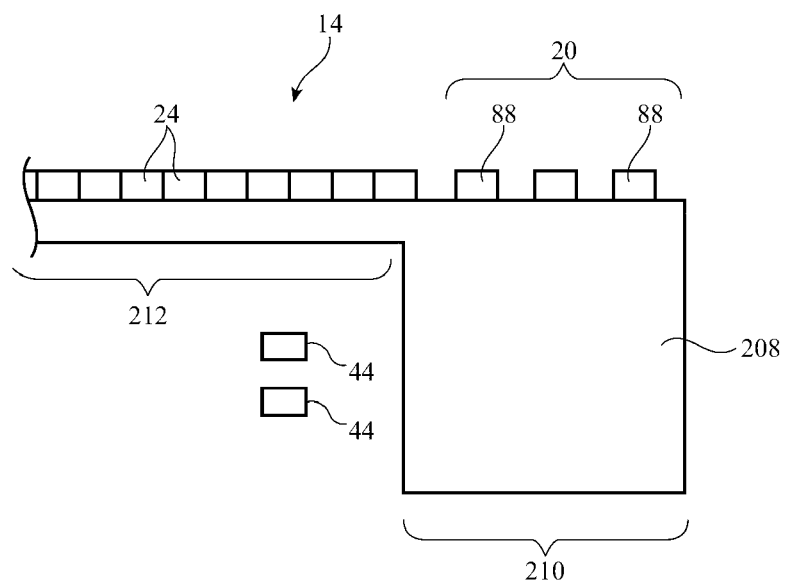
FIG. 32 is a cross-sectional side view of an illustrative display overlapping a printed circuit with a thinned central portion to accommodate components in accordance with an embodiment.

If desired, printed circuit 208 may be locally thinned to provide space within device 10 for internal device components 44, as shown in FIG. 32. In the illustrative configuration of FIG. 32, edge portion 210 of printed circuit 208 is thicker than center portion 212 of printed circuit 208. This allows components 44 to be mounted under portion 212. Light-emitting diodes 88 or other edge illuminator components may be mounted on the upper surface of edge portion 210 of printed circuit 208 to form edge illuminator 20. Light-emitting diode pixels such as organic light-emitting diode pixels or other pixels 24 may be attached to the upper surface of printed circuit 208 in region 212 to form display 14.

Figure 33:
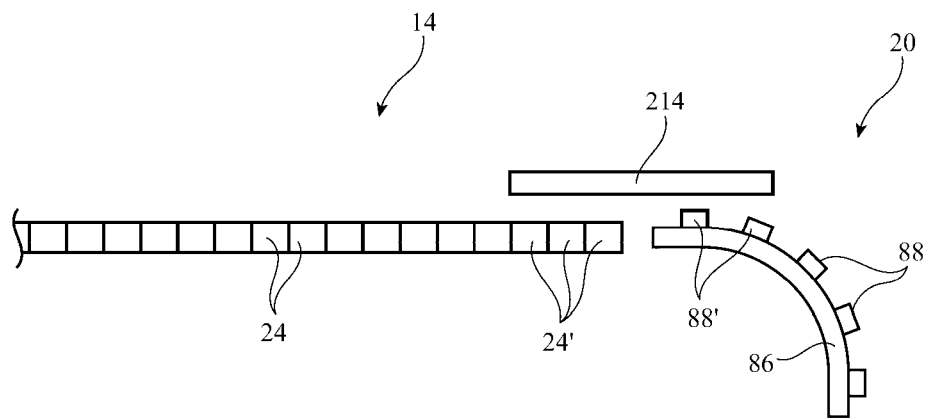
FIG. 33 is a cross-sectional side view of an illustrative display with an array of pixels and adjacent illuminated edge structures overlapped by a diffuser layer in accordance with an embodiment.

As shown in FIG. 33, a diffuser such as diffuser 214 may overlap adjacent portions of printed circuit 86 and light-emitting diodes 88 in edge illuminator 20 and the pixels in display 14. Diffuser 214 may be formed from a layer of polymer with embedded light-scattering particles. The light-scattering particles may be formed from a metal oxide or other inorganic dielectric material and/or other materials with a refractive index that differs from the refractive index of the polymer in the layer of polymer. Display 14 may have an array of pixels 24 that display an image for a user of device 10. Some pixels along the edge of pixels 24 such as edge pixels 24' may be overlapped by diffuser 214. Adjacent light-emitting diodes in edge illuminator 20 such as light-emitting diodes 88' may also be overlapped by diffuser 214. As light is emitted from pixels 24' and light-emitting diodes 88', this light will be diffused by diffuser 214, thereby helping to obscure the boundary between edge illuminator 20 and display 14. If desired diffuser 214 may be formed by coating pixels 24' and light-emitting diodes 88' with a polymer coating that contains light-emitting particles and/or that has a light diffusing texture.

Figure 34:
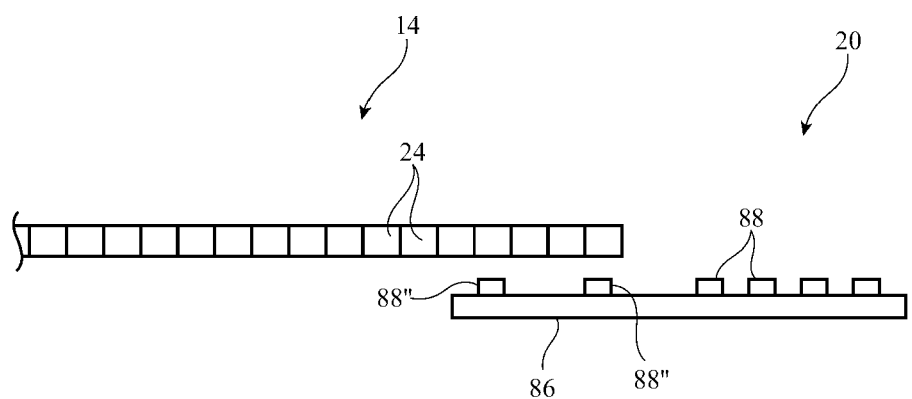
FIG. 34 is a cross-sectional side view of an illustrative substrate with light-emitting diodes of variable pitch overlapped by an edge portion of a display layer in accordance with an embodiment.

In the illustrative example of FIG. 34, light-emitting diodes 88 in edge illuminator 20 have a density that varies as a function of lateral distance away from pixels 24 (and therefore as a function of distance from the peripheral edge of device 10). Some of the light-emitting diodes of edge illuminator 20 such as light-emitting diodes 88" may be overlapped by pixels 24 of display 14. Pixels 24 may contain spaces between metal lines and other opaque structures that allow pixels 24 to be at least partly transparent to light emitted from light-emitting diodes 88". Accordingly, light from light-emitting diodes 88" may blend with light emitted from pixels 24 along the edge of display 14 during operation. The density of light-emitting diodes 88 (number of diodes per unit area) may also be adjusted (increased or decreased) as a function of distance lateral distance. In this way, the boundary between the light-emitting diodes of edge illuminator 20 and the light-emitting diodes or other components of pixels 24 may be visually obscured and/or the optical attributes of edge illuminator 20 may be adjusted.

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. A wearable electronic device having a front, a rear, and sidewalls that extend between the front and the rear, the wearable electronic device comprising:
    a display having an array of pixels having a peripheral edge, wherein the array of pixels is configured to display an image;
    light-emitting diodes around the peripheral edge, wherein the light-emitting diodes are separate from the display; and
    a display cover layer that overlaps the array of pixels and the light-emitting diodes, wherein the display cover layer has a first portion at the front and second portions at the sidewalls, the array of pixels is configured to display the image through the first portion, and the light-emitting diodes are configured to emit light through the first and second portions.

2. The wearable electronic device defined in claim 1 further comprising a housing in which the display and the light-emitting diodes are mounted, wherein the display is an organic light-emitting diode display.

3. The wearable electronic device defined in claim 1 wherein the light-emitting diodes are formed from crystalline semiconductor light-emitting diode dies.

4. The wearable electronic device defined in claim 3 further comprising:
    a flexible substrate on which the crystalline semiconductor light-emitting diode dies are mounted.

5. The wearable electronic device defined in claim 1 further comprising transparent material interposed between the light-emitting diodes and the display cover layer.

6. The wearable electronic device defined in claim 5 wherein the transparent material comprises polymer that is configured to diffuse the light emitted by the light-emitting diodes.

7. The wearable electronic device defined in claim 1 further comprising:
    a layer of opaque material on a surface of the display cover layer overlapping the light-emitting diodes, wherein the layer of opaque material has openings that are configured to allow the light emitted by the light-emitting diodes to pass through the display cover layer.

8. The wearable electronic device defined in claim 1 further comprising:
    a printed circuit substrate on which the array of pixels and the light-emitting diodes are mounted.

9. The wearable electronic device defined in claim 8 wherein the printed circuit substrate comprises a rigid flex printed circuit that has a rigid printed circuit portion on which the array of pixels is mounted and that has a flexible printed circuit portion extending from the rigid printed circuit portion, and wherein the light-emitting diodes are mounted on the flexible printed circuit portion.

10. A wristwatch device, comprising:
    a housing having sidewalls;
    a display in the housing, wherein the display has a peripheral edge, wherein the display is configured to display images;
    light-emitting components that extend around the display between the peripheral edge and the sidewalls, wherein the light-emitting components are configured to emit light; and
    a display cover layer overlapping the display and the light-emitting components, wherein the display cover layer comprises a first planar region and a second region that includes corners with compound curvature, the display and the light-emitting components are configured to display the images and emit the light through the display cover layer, the display is configured to display the images in the first planar region, and the light-emitting components are configured to emit the light in the second region.

11. The wristwatch device defined in claim 10 wherein the housing comprises a metal selected from the group consisting of: stainless steel and aluminum.

12. The wristwatch device defined in claim 11 wherein the display cover layer comprises a transparent material selected from the group consisting of: glass, polymer, sapphire, and ceramic.

13. The wristwatch device defined in claim 12 wherein the display cover layer at least partially overlaps the sidewalls of the housing.

14. The wristwatch device defined in claim 13 further comprising:
    a printed circuit substrate, wherein the display comprises an array of pixels that is mounted on the printed circuit substrate, and wherein the light-emitting components comprise light-emitting diodes are mounted on the printed circuit substrate.

15. The wristwatch device defined in claim 14 wherein the printed circuit substrate comprises a mesh-shaped portion and wherein the light-emitting diodes are mounted on the mesh-shaped portion.

16. The wristwatch device defined in claim 13 further comprising:
    a first printed circuit substrate on which an array of pixels of the display is mounted; and
    a second printed circuit substrate on which the light-emitting components are mounted.

17. The wristwatch device defined in claim 12 further comprising:
    a health sensor mounted in the housing.

18. The wristwatch device defined in claim 12 wherein a given one of the sidewalls comprises a transparent portion and wherein the light-emitting components are configured to emit the light through the transparent portion of the given one of the sidewalls.

19. A wearable electronic device, comprising:
    a housing having a rear portion and a sidewall that extends from the rear portion;
    a display comprising an array of pixels in the housing, wherein the array of pixels is configured to display an image;
    light-emitting components that surround the array of pixels, wherein the light-emitting components are configured to emit light that is separate from the image;

a display cover layer, wherein the image displayed by the display and a first portion of the light emitted by the light-emitting components are configured to pass through the display cover layer; and a transparent layer interposed between the display cover layer and the sidewall, wherein a second portion of the light emitted by the light-emitting component is configured to pass through the transparent layer.

20. The wearable electronic device defined in claim 19 wherein the housing is metal and wherein the light-emitting components extend from an edge of the display to the sidewall of the housing.

\* \* \* \* \*

UNITED STATES PATENT AND TRADEMARK OFFICE
CERTIFICATE OF CORRECTION

Page 1 of 1

PATENT NO. : 11,910,690 B2
APPLICATION NO. : 17/470881
DATED : February 20, 2024
INVENTOR(S) : Paul X. Wang and Dinesh C. Mathew It is certified that error appears in the above-identified patent and that said Letters Patent is hereby corrected as shown below:

In the Claims

Column 20, Line 39, "light-emitting diodes are mounted" should read -- light-emitting diodes mounted --

Signed and Sealed this
Eighth Day of October, 2024

Katherine Kelly Vidal
*Director of the United States Patent and Trademark Office*